(12) United States Patent
Santos

(10) Patent No.: US 7,546,780 B2
(45) Date of Patent: Jun. 16, 2009

(54) SENSOR MOUNTING STRUCTURE ALLOWING FOR ADJUSTMENT OF SENSOR POSITION

(75) Inventor: Roberto S. Santos, Hudson, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 411 days.

(21) Appl. No.: 11/240,034

(22) Filed: Sep. 30, 2005

(65) Prior Publication Data
US 2007/0074592 A1 Apr. 5, 2007

(51) Int. Cl.
*G01D 11/00* (2006.01)
(52) U.S. Cl. .................. 73/866.5; 198/339.1
(58) Field of Classification Search ............. 73/866.5; 198/339.1
See application file for complete search history.

(56) References Cited

U.S. PATENT DOCUMENTS

| | | | |
|---|---|---|---|
| 1,895,179 A | 1/1933 | Thresher | 248/27.1 X |
| 2,497,456 A | 2/1950 | Johnson | 74/424.8 |
| 2,791,905 A * | 5/1957 | Cheney | 73/170.01 |
| 3,010,363 A | 11/1961 | Malfeld | 88/40 |
| 3,213,189 A | 10/1965 | Mitchell et al. | |
| 3,281,660 A * | 10/1966 | Studenick | 324/326 |
| 3,354,302 A | 11/1967 | Greasley | 240/8.16 |
| 3,576,563 A | 4/1971 | Scott et al. | 340/380 |
| 3,750,466 A * | 8/1973 | Ott et al. | 73/159 |
| 4,262,181 A | 4/1981 | Tufano et al. | 200/296 |
| 4,505,054 A | 3/1985 | Clark et al. | 33/357 |
| 4,510,408 A | 4/1985 | Jovick et al. | 310/168 |
| 4,515,336 A | 5/1985 | Fischer | 248/288.3 |
| 4,633,081 A | 12/1986 | Hiramatu | |
| 4,798,964 A * | 1/1989 | Schmalfuss et al. | 250/559.22 |
| 4,805,455 A * | 2/1989 | DelGiorno et al. | 73/379.01 |
| 5,195,364 A * | 3/1993 | Dehe et al. | 73/81 |
| 5,205,042 A * | 4/1993 | Greter et al. | 33/365 |

(Continued)

FOREIGN PATENT DOCUMENTS

CN 2715932 8/2005

(Continued)

OTHER PUBLICATIONS

MH15: Short housing, clever mounting—for smart solutions Data Sheets, SICK AG, pp. 1-22.

(Continued)

*Primary Examiner*—Thomas P Noland
(74) *Attorney, Agent, or Firm*—Whyte Hirschboeck Dudek; William R. Walbrun

(57) ABSTRACT

A mounting device configured for mounting a sensing device in relation to a supporting structure, and related method of mounting, are disclosed. In at least some embodiments, the mounting device includes a first support component capable of being mounted at least indirectly in relation to the supporting structure, a second support component configured to support the sensing device, and a connecting component coupled between the first and second support components, where the connecting component supports the second support component in relation to the first support component. Also, the mounting device includes an adjustor coupled to at least one of the first support component, the second support component and the connecting component that influences a positioning of the second support component in relation to the first support component.

51 Claims, 8 Drawing Sheets

U.S. PATENT DOCUMENTS

| | | | |
|---|---|---|---|
| 5,412,816 A * | 5/1995 | Paterson et al. | 4/623 |
| 5,542,859 A | 8/1996 | Ison et al. | 439/536 |
| 5,617,762 A | 4/1997 | Kirsch | 74/490.06 |
| 5,621,370 A | 4/1997 | St. Louis | 337/380 |
| 5,806,955 A | 9/1998 | Parkyn, Jr. et al. | 362/31 |
| 5,938,310 A | 8/1999 | Leaman et al. | |
| 5,954,310 A | 9/1999 | Soldo et al. | 248/660 |
| 5,966,991 A | 10/1999 | Gosselin et al. | 74/490.01 |
| 6,025,963 A | 2/2000 | Hippenmeyer et al. | 359/819 |
| 6,033,100 A | 3/2000 | Marquiss et al. | |
| 6,147,820 A | 11/2000 | Anselment et al. | 359/823 |
| 6,204,501 B1 | 3/2001 | Cutler | 250/352 |
| 6,227,501 B1 | 5/2001 | Malcolm | |
| 6,244,107 B1 | 6/2001 | Nelson et al. | 73/431 |
| 6,318,694 B1 | 11/2001 | Watanabe | 248/371 |
| 6,322,275 B1 | 11/2001 | Schmidt et al. | 403/14 |
| 6,352,037 B1 | 3/2002 | Doyle | 108/20 |
| 6,360,999 B1 | 3/2002 | Liao | 248/27.1 |
| 6,441,361 B1 | 8/2002 | Bennett, Jr. et al. | 250/221 |
| 6,550,679 B2 | 4/2003 | Hennick et al. | 235/454 |
| 6,599,049 B2 | 7/2003 | Erben | 403/27 |
| 6,614,601 B2 | 9/2003 | Dallakian | 359/804 |
| 6,632,008 B2 | 10/2003 | Kalkbrenner | 362/554 |
| 6,720,884 B2 | 4/2004 | O'Connor et al. | 340/643.6 |
| 6,760,206 B2 | 7/2004 | Daharsh et al. | 361/93.1 |
| 6,799,376 B1 * | 10/2004 | Voeller et al. | 33/203.18 |
| 6,858,172 B2 | 2/2005 | Daharsh et al. | 264/272.14 |
| 6,892,594 B2 | 5/2005 | Buck et al. | 73/866.5 |
| 6,937,812 B2 | 8/2005 | Schladenhauffen et al. | 385/146 |
| 7,256,891 B2 * | 8/2007 | Domack et al. | 356/400 |
| 2003/0211041 A1 * | 11/2003 | Ezratty et al. | 424/9.2 |
| 2004/0031385 A1 | 2/2004 | Neuhaeuser | 92/5 |
| 2004/0049353 A1 * | 3/2004 | Ezratty | 702/19 |
| 2004/0175988 A1 | 9/2004 | Chang et al. | |
| 2005/0263964 A1 * | 12/2005 | Kumoi | 280/5.5 |

FOREIGN PATENT DOCUMENTS

| | | |
|---|---|---|
| DE | 19626291 A1 | 1/1998 |
| EP | 0037896 B1 | 2/1985 |
| FR | 2531568 A1 | 2/1984 |
| GB | 2311805 A | 10/1997 |
| JP | 62236742 A * | 10/1987 |
| WO | 97/48578 A | 12/1997 |

OTHER PUBLICATIONS

EC Declaration of Conformity, SICK, 3 pages, by Jun. 2006.
Photoelectric Sensors, Accessories, p. 638, 2000 Edition, SICK.
SMB18S Swivel Mount Bracket datasheet, Oct. 2002., Banner, 1 page.
Sensor Accessories Sensor Mounting Brackets data sheets, pp. 1-3, Eaton Cutler-Hammer, Jun. 2004.
Installation Accessories data sheets, Micro Detectors, Jan. 2003, 3 pages.
Sensor Brackets and Accessories 2004-2005 (link to pdf file), http://www.softnoze.com/catalog.cfm, 1 page.
ProxPort™ Mount & Conversion Brackets datasheet, Softnoze USA, Inc, 1 page by Jun. 2006.
Swivel-style Universal Brackets (SUB) datasheet, Softnoze USA, Inc., 1 page by Jun. 2006.
Accessories—Cables and Connectors—Brackets, pp. 740-754, Banner Engineering Corp., www.bannerengineering.com, by Jun. 2006.
Fixing Brackets and Supports, Sensor Accessories, ST Series datasheets, Datasensor, 4 pages Jan. 2005.
Photoswitch® Photoelectric Sensors, Introduction, pp. RI-17 to RI-19, Allen-Bradley, by Jun. 2006.
Photoswitch® Photoelectric Sensors, Accessories, Contents, pp. 1-374 to 1-379, Allen-Bradley, by Jun. 2006.
Sentek Econorush Sensor Holder, Sentek Limited UK, http://www.sentek.co.uk/econrush.htm, pp. 1-2; Feb. 2005.
Rosheim, Mark E., Mechanical Design of an Omni-Directional Sensor Mount abstract, http://www.stormingmedia.us/04/0448/A044804.html, 1 page Feb. 2005.

* cited by examiner

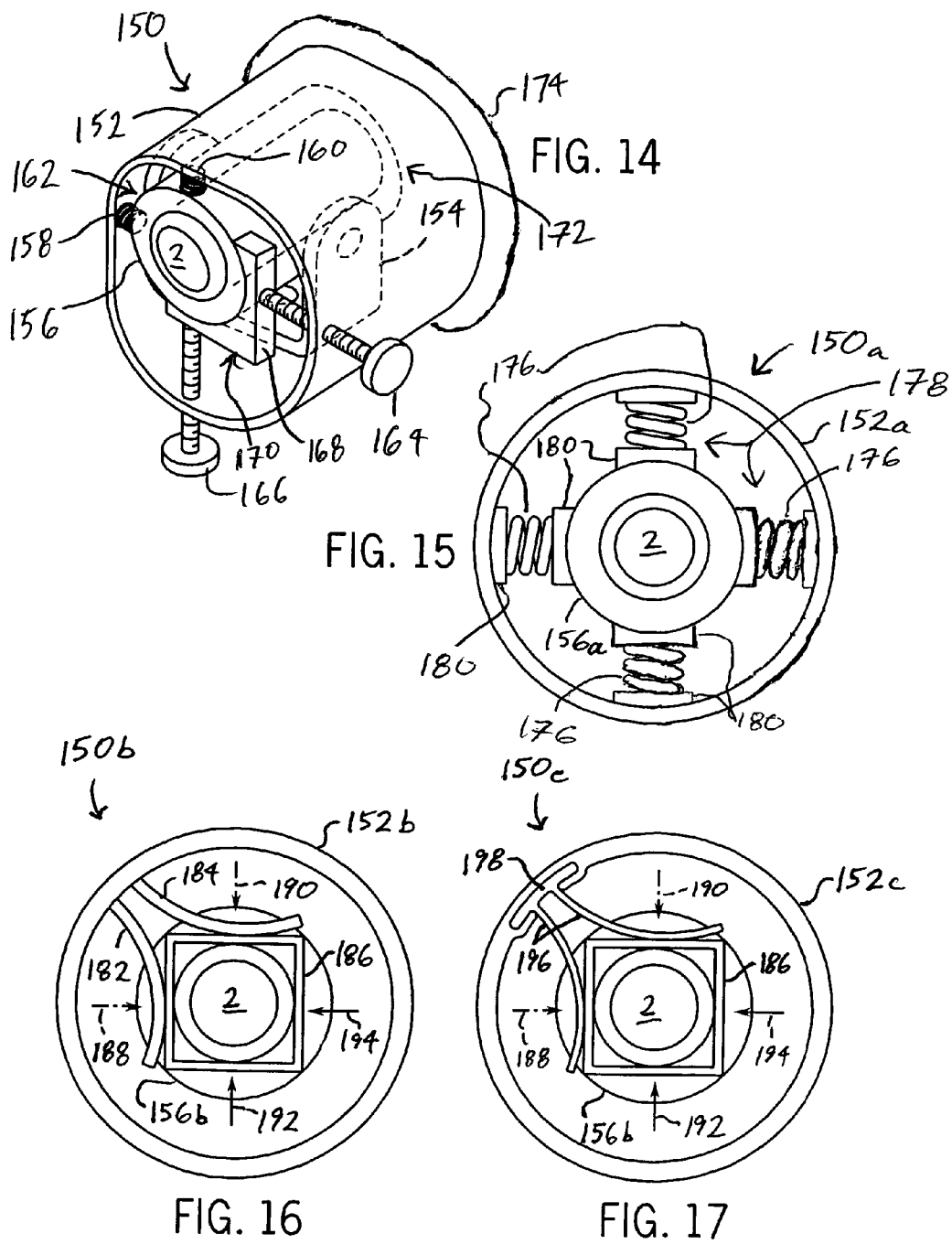

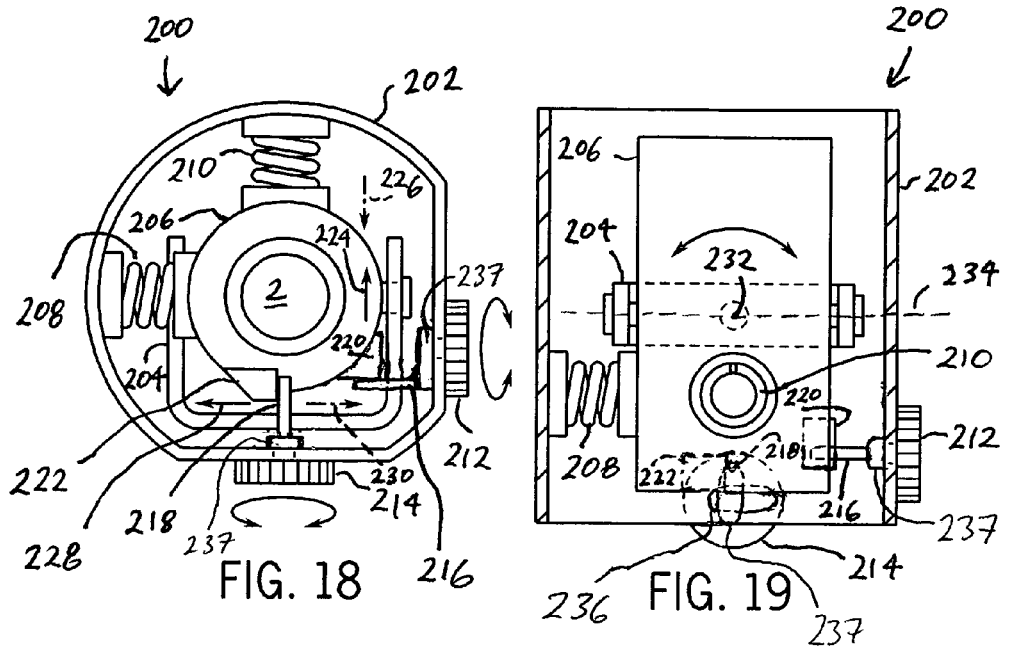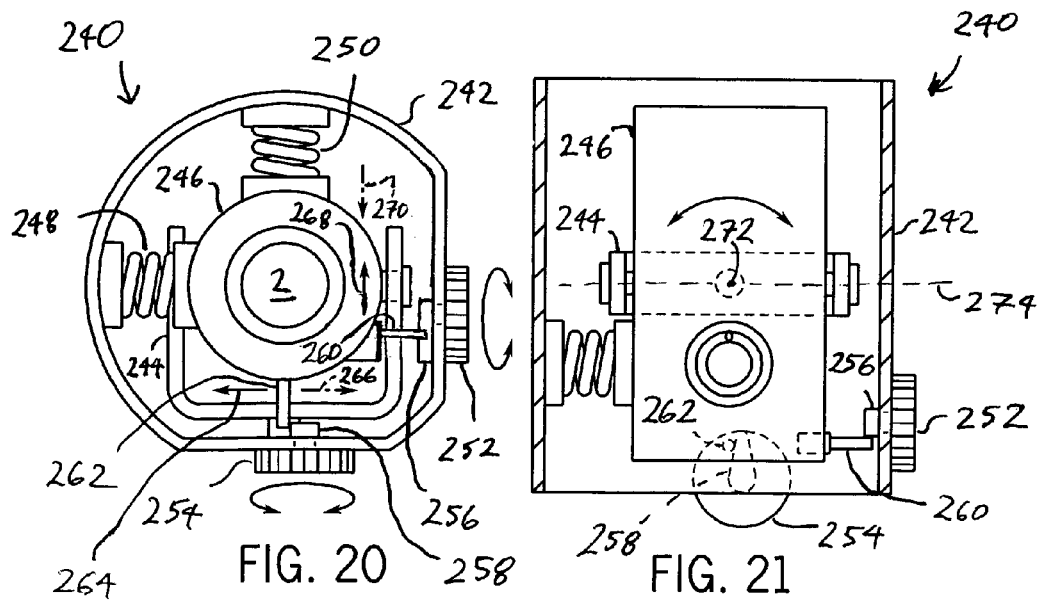

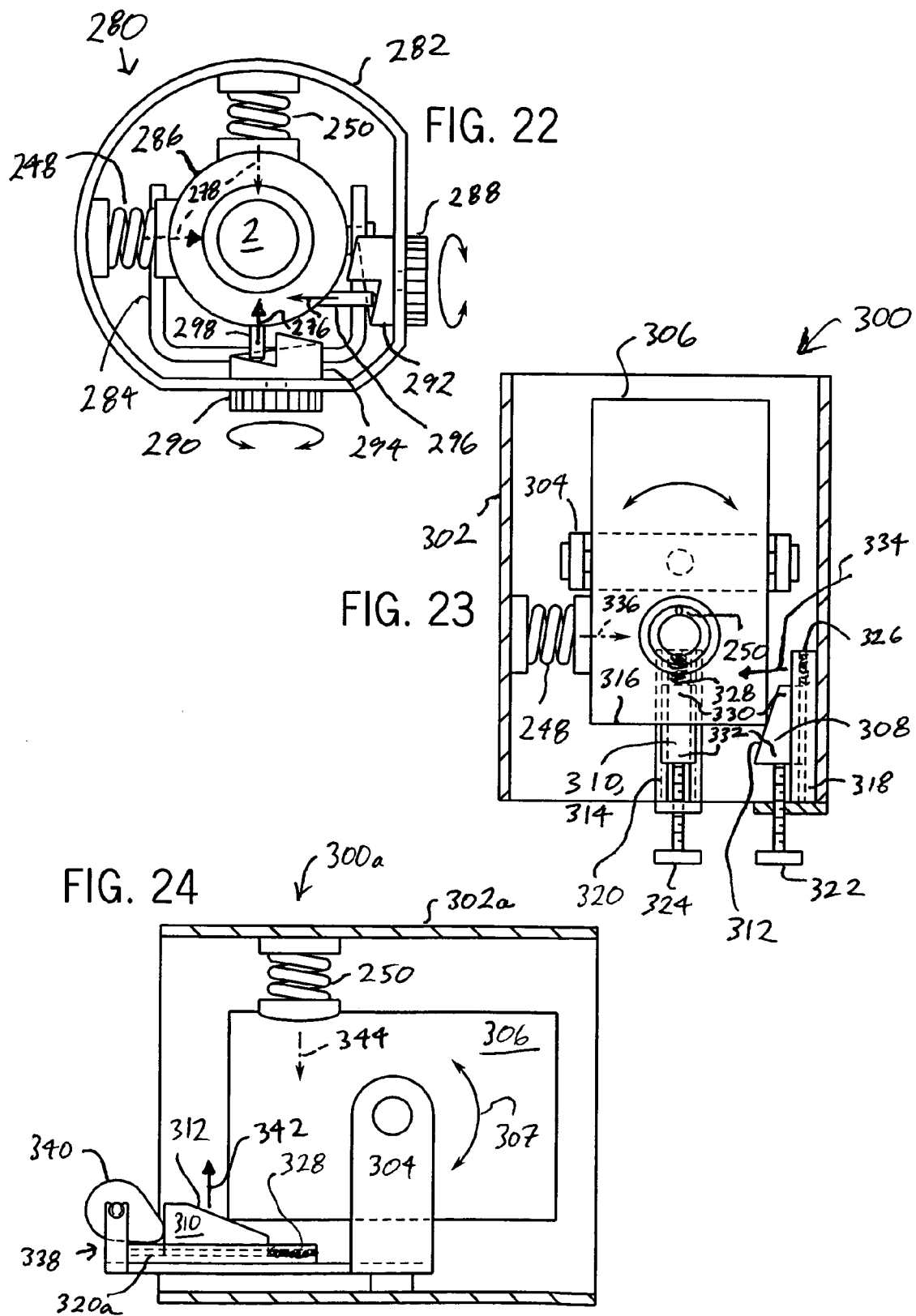

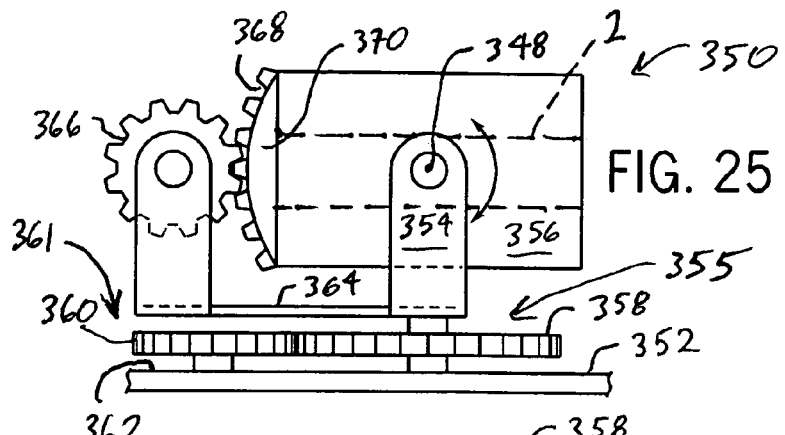
FIG. 25
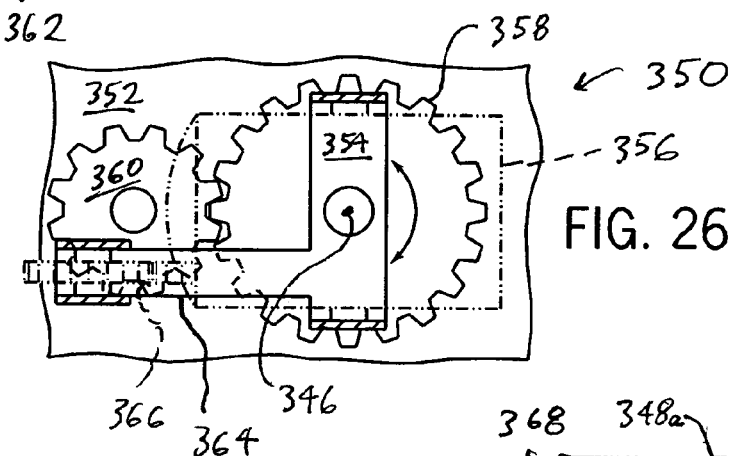
FIG. 26
FIG. 27
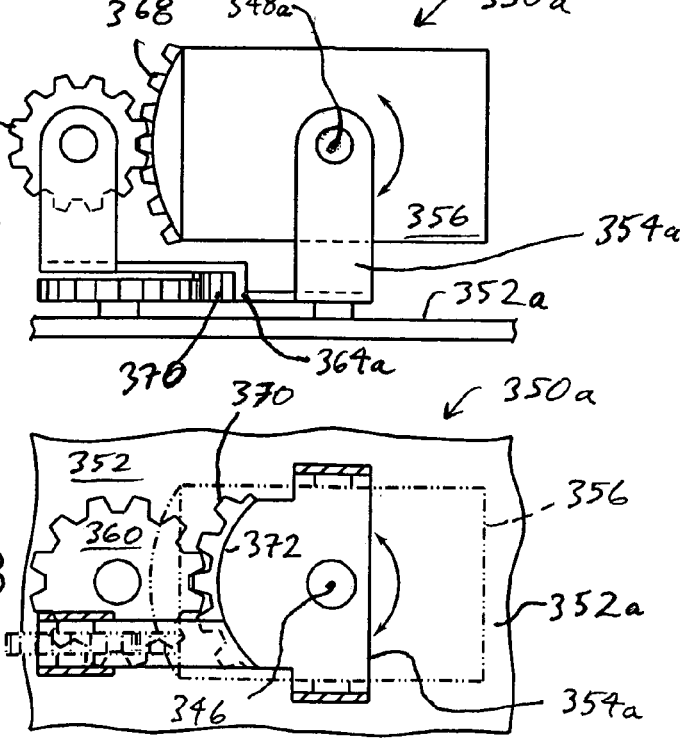
FIG. 28

SENSOR MOUNTING STRUCTURE ALLOWING FOR ADJUSTMENT OF SENSOR POSITION

CROSS-REFERENCE TO RELATED APPLICATIONS

STATEMENT REGARDING FEDERALLY SPONSORED RESEARCH OR DEVELOPMENT

FIELD OF THE INVENTION

The present invention relates to sensing devices and, more particularly, relates to various mechanisms, structures and/or methods for mounting sensing devices onto other structures.

BACKGROUND OF THE INVENTION

Sensing devices of many different types are commonly employed in a variety of environments and applications. Sensing devices encompass a broad spectrum of devices including, for example, various light-sensing devices such as laser-sensing devices, light sensing devices that are capable of distinguishing among different colors of visible light, and devices for sensing various other types of radiation including infrared radiation or heat, microwave radiation, and x-ray radiation. Additionally, other sensing devices include, for example, devices that are capable of sensing the position of other structures, acoustic sensors, vibration sensors, motion sensors such as accelerometers, orientation sensors involving gyroscopes, and numerous other types of sensing devices.

Sensing devices are employed in a wide variety of industrial, commercial, military, residential and other environments and applications. For example, in industrial environments, light sensors are often employed in conjunction with conveyor systems such as those used in assembly lines. Such light sensors are often used to detect the presence of objects moving down an assembly line and to determine whether a given object has entered or exited a particular region of the assembly line. Light sensors of similar design can also be used in residential applications, for example, in connection with garage door openers. Also for example, in many commercial facilities as well as residential homes, various sensing devices are used in security systems in order to detect the presence of potential intruders within or nearby those facilities or homes. Sensing devices can further be implemented on vehicles, for example, to detect the presence of objects behind vehicles. Indeed, sensing devices are ubiquitous in today's modern world.

Although in some cases sensing devices are free-standing, typically sensing devices are mounted upon or in relation to other supporting structures. Further, in many if not most circumstances, it is desirable that the sensing devices be mounted in relation to such supporting structures in a fixed manner, or at least in a manner by which the location and orientation of a given sensing device relative to the supporting structure(s) and/or a signal source is known or predictable. For example, in the case of a light sensing device implemented in a manufacturing assembly line, it is typically desired that the light sensing device be fixedly orientated in a particular direction so as to be aligned to receive a light beam from a light source located elsewhere. The mounting of light sensing devices in other environments, such as in the case of garage door openers, similarly can entail the careful, fixed positioning of the sensing devices.

Although in many circumstances it is desirable for a sensing device to be mounted in a manner such that the position of the sensing device is accurately fixed or at least limited to being within a predictable or predetermined range, it is often difficult to install sensing devices such that the sensing devices are mounted in this manner. The panels, walls, protruding structures, and other supporting structures on which sensing devices are mounted can have a variety of different shapes, sizes, configurations, orientations and positions depending upon the circumstance. Consequently, mounting a sensing device onto a supporting structure by way of a simple procedure (e.g., simply attaching the sensing device to the supporting structure by way of bolts or screws) often does not result in a desired arrangement of the sensing device.

Although in some applications multiple sensing devices are intended to be respectively mounted on respective components of the same type in largely the same manner, in such cases there often still is insufficient standardization of the supporting structures or other related structures/devices to allow for the sensing devices to be mounted in a repetitive manner on the multiple structures without fine adjustment of the positioning of the individual sensing devices. Indeed, it is often the case that the supporting structures on which sensing devices are to be mounted are not designed or manufactured to the tolerances that should be satisfied in the positioning of the sensing devices to allow for proper operation of those sensing devices. Again for example with respect to assembly lines, while multiple light sensing devices might be respectively mounted on respective successive conveyor sections in an assembly line, fine adjustment of each of the positions of the sensing devices typically is still desirable to achieve proper alignment of those sensing devices with their respective light sources.

Given the above considerations, certain intermediary mounting structures or mechanisms have been developed that allow sensing devices to be mounted onto other supporting structures in manners that allow for some adjustment, in terms of the positioning of the sensing devices relative to the supporting structures (and/or other structures/devices, such as signal sources). Yet such conventional mounting mechanisms are limited in terms of their capabilities. In some cases, such conventional mounting mechanisms only allow very slight adjustments in the positioning of sensing devices relative to the supporting structures on which the sensing devices are being mounted via the mounting mechanisms. Also, the designs of many conventional mounting mechanisms make it difficult for persons installing sensing devices to achieve specific desired positions, that is, to finely adjust the positions of the sensing devices and set or lock the sensing devices in those positions. Also, in some cases, even if during installation it is possible to achieve a specific desired position, it often is not possible or easy for the person doing the installing (or other persons) to determine that the desired position has been achieved.

For at least these reasons, therefore, it would be advantageous if improved mounting mechanisms or structures for use in mounting sensing devices to other support structures could be developed. In particular, in at least some embodiments, it would be advantageous if such improved mounting mechanisms facilitated the accurate positioning of sensing devices with respect to other supporting structures and/or other structures or devices in a manner that allowed for significant variation in sensor positioning. Also, in at least some embodiments, it would be advantageous if the mounting mechanisms facilitated the accurate positioning of sensing devices and even, at least in some cases, provided some corroboration that desired positions for the sensing devices had been achieved.

BRIEF SUMMARY OF THE INVENTION

The present inventor has recognized that a variety of improved mounting devices or mechanisms for mounting sensing devices to supporting structures could be developed. More particularly, the present inventor has recognized that, in at least some embodiments, such mounting devices could employ a first component for supporting a sensing device, a second component to be mounted onto a supporting structure, and a third component for connecting the first component to the second component in a manner that allowed for some relative movement between the first and second components. The present inventor further has recognized that, in at least some additional embodiments, one or more adjustment component(s) could be added to the assembly to allow for controlled adjustment of the positioning of the first and second components in relation to one another, thus allowing for controlled adjustment of the positioning of the sensing device in relation to the supporting structure.

More particularly, in at least some embodiments, the present invention relates to a mounting device configured for mounting a sensing device in relation to a supporting structure. The mounting device includes a first support component capable of being mounted at least indirectly in relation to the supporting structure, a second support component configured to support the sensing device, and a connecting component coupled between the first and second support components, where the connecting component supports the second support component in relation to the first support component. The mounting device further includes an adjustor coupled to at least one of the first support component, the second support component and the connecting component that influences a positioning of the second support component in relation to the first support component.

Additionally, in at least some embodiments, the present invention relates to a mounting device configured for mounting a sensing device in relation to a supporting structure. The mounting device includes a first support component capable of being mounted at least indirectly in relation to the supporting structure, a second support component configured to support the sensing device, means for rotatably coupling the first and second support components in relation to one another, and means for adjusting a relative orientation of the first and second support components with respect to one another.

Further, in at least some embodiments, the present invention relates to a method of mounting a sensing device in relation to a supporting structure. The method includes placing a sensing device onto a first support component, and mounting an assembly including the first support component and the sensing device onto a supporting structure, where the assembly further includes a connecting component and a second support component, where the connecting component rotatably couples the first and second support components with one another, and where the assembly is mounted onto the supporting structure specifically by way of the second support component. The method additionally includes setting a rotational orientation of at least one of the first support component and the sensing device with respect to at least one of the second support component and the supporting structure.

BRIEF DESCRIPTION OF THE DRAWINGS

FIG. 14 is a rear perspective view of a modified version of the mounting mechanism of FIG. 5 that additionally employs springs and set screws, in accordance with at least one embodiment of the present invention, with a supporting structure on which the mounting mechanism is to be mounted not being shown;

FIG. 15 is a front elevation view of an alternate embodiment of the mounting mechanism and sensing device of FIG. 5, with a circular or "mushroom" flange of the mounting mechanism not shown, where a set of springs is employed as a connecting component instead of a yoke-type connecting component;

FIGS. 16-17 show rear elevation views of additional modified versions of the mounting mechanism of FIG. 14 that, in accordance with certain embodiments of the present invention, employ leaf springs instead of compression springs, and where a circular flange and set screws of the mounting mechanism are not shown;

FIG. 18 is a rear elevation view of a further modified version of the mounting mechanism of FIG. 14 that, in accordance with certain embodiments of the present invention, employs springs and knobs with push rods, where a circular or "mushroom" flange of the mounting mechanism is not shown;

FIG. 19 is a top plan view of the mounting mechanism of FIG. 18, shown in partial cutaway with a top portion of a first support component removed;

FIGS. 20 and 22 are rear elevation views of additional modified versions of the mounting mechanism of FIG. 14 that, in accordance with certain embodiments of the present invention, employ springs and cams (of first and second types, respectively), where circular flanges of the mounting mechanisms are not shown;

FIG. 21 is a top plan view of the mounting mechanism of FIG. 20, shown in partial cutaway with a top portion of a first support component removed;

FIG. 23 is a top plan view of an additional modified version of the mounting mechanism of FIG. 14, shown in partial cutaway with a top portion of a first support component removed, which employs springs and ramps actuated by way of set screws, where a circular flange of the mounting mechanism is not shown;

FIG. 24 is a side elevation view of a further modified version of the mounting mechanism of FIG. 14, shown in partial cutaway with a side portion of a first support component removed, which employs cam-actuated ramps (one of each being shown), and where a circular flange of the mounting mechanism is not shown;

FIGS. 25 and 27 are side elevation views, shown in cutaway, of two additional modified versions of the mounting mechanism of FIG. 5 that employ gears, in accordance with at least some embodiments of the present invention; and FIGS. 26 and 28 are top plan views of the mounting mechanisms of FIGS. 25 and 27, respectively, with the mounting mechanisms being shown in cutaway.

DETAILED DESCRIPTION OF THE PREFERRED EMBODIMENT

Figure 1:
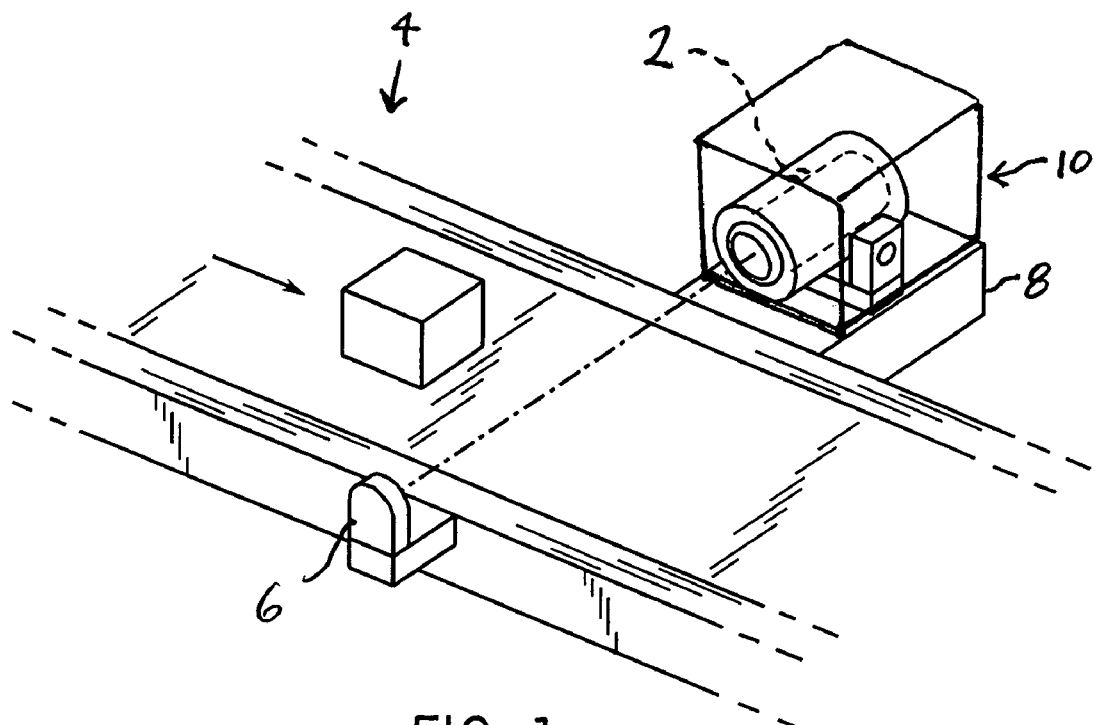
FIG. 1 is a perspective view of a sensing device implemented in one exemplary application, in accordance with at least one embodiment of the present invention.

Referring to FIG. 1, a sensing device 2 is shown to be implemented in one exemplary application, namely, a conveyor system 4 as is often found in manufacturing and other commercial facilities implemented in assembly lines or the like. The sensing device 2 in the present embodiment is a light sensing device capable of receiving and detecting the presence of a light beam (e.g., a laser beam) emitted by a light source 6 located on the opposite side of the conveyor system 4. As shown, the sensing device 2 in particular is mounted onto a supporting structure 8 of the conveyor system 4 by way of a mounting mechanism 10. As discussed in further detail below with respect to the other FIGS., the mounting mechanism 10 can take a variety of forms in accordance with a variety of embodiments of the present invention.

Exemplary applications for the light sensing device arrangement of FIG. 1 can include, for example, "transmitted beam" or "through beam" applications. However, other applications, including but not limited to "retroreflective" and "diffuse" applications, are known and considered to be within the scope of present invention. In the context of a retroreflective application, for example, the sensing device 2 would both emit and detect light that was reflected off of a target reflector that can be positioned where the light source 6 is located. Similarly, in the context of a diffuse application, the sensing device 2 would both emit and detect light that was reflected off of the object to be sensed (i.e., without the use of a light source positioned where the light source 6 is shown to be located).

Although the sensing device 2 of FIG. 1 is a light sensing device, it should be understood that the present invention encompasses a variety of different embodiments that are applicable in relation to numerous different types of sensing devices including, for example, other light-sensing devices (e.g., color-sensing devices, etc.), devices for sensing various other types of radiation (e.g., infrared, microwave, x-ray, etc.), position-sensing devices, acoustic sensors, vibration sensors, motion sensors such as accelerometers, orientation sensors involving gyroscopes, and numerous other types of sensing devices. Also, while FIG. 1 shows the sensing device 2 to be implemented in connection with the conveyor system 4, it should be understood that the present invention encompasses a variety of embodiments that are applicable with respect to the mounting of a variety of different types of sensing devices onto a variety of different supporting structures in a variety of different industrial, commercial, military, residential and other environments and/or in connection with a variety of different applications.

Figure 2:
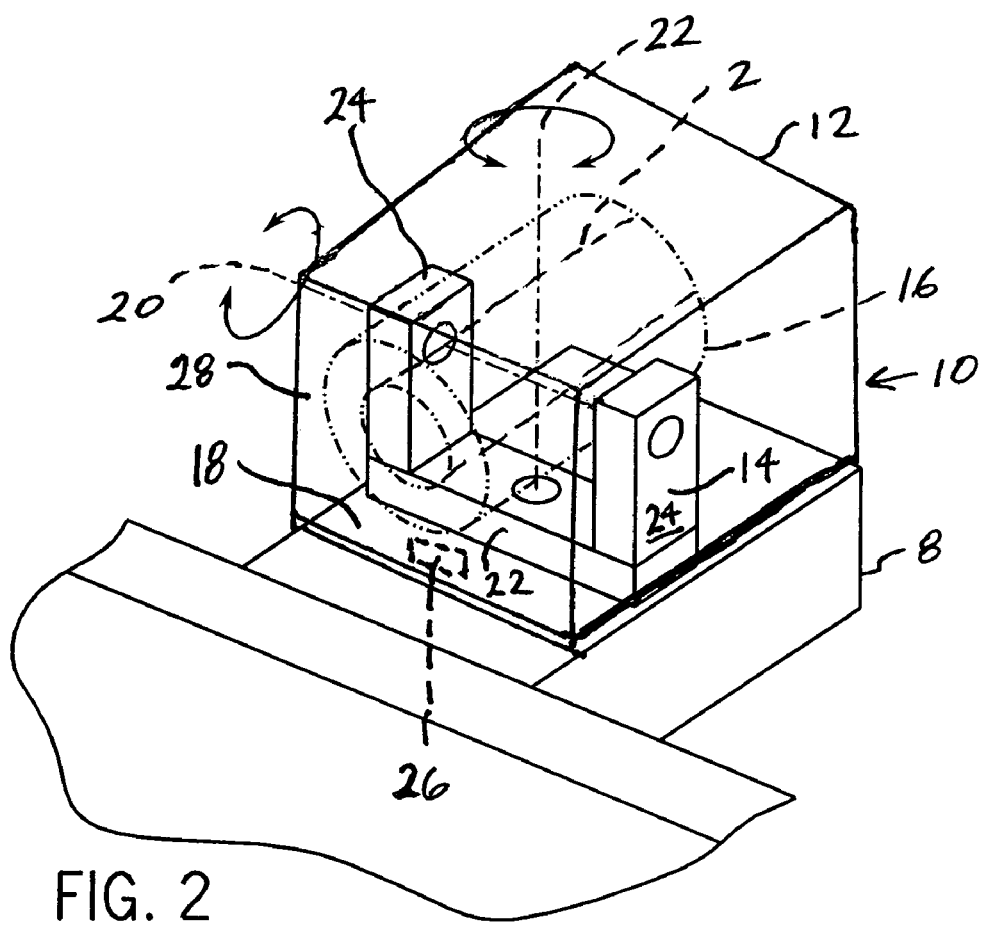
FIG. 2 is an additional perspective view of the sensing device of FIG. 1 further illustrating aspects of an exemplary mounting mechanism by which the sensing device is mounted onto a supporting structure in accordance with at least one embodiment of the present invention.

Referring additionally to FIG. 2, the mounting mechanism 10, sensing device 2 and supporting structure 8 are shown again in an enlarged, perspective view (with a portion of the mechanism and the sensing device being shown in phantom). In the present embodiment, the mounting mechanism 10 has a first support component 12 that is substantially box-shaped (e.g., has a rectangular cross-section) and that surrounds, and supports within it, a connecting component 14 and a second support component 16. As shown, the sensing device 2 is positioned and supported within the second support component 16, with both the sensing device and the second support component being substantially cylindrical in shape and the sensing device being coaxially fitted within the second support component. The second support component in turn is supported on the connecting component 14, which is supported by (and mounted upon) a floor 18 of the first support component 12.

Further as illustrated in FIG. 2, the second support component 16 is movable in relation to the first support component 12. More particularly, the connecting component 14 in the present embodiment is in the form of a yoke (or, in some cases, a yoke having multiple parts such as rings that are movable relative to one another, e.g., a gimbal) that allows the second support component 16 to be rotatable about first and second axes 20 and 22, respectively, relative to the first support component 12. More specifically as shown, the yoke-type connecting component 14 includes a substantially horizontal portion 22 and a pair of substantially vertical portions 24. The second support component 16 is rotatably coupled in between the pair of vertically-extending portions 24, and is rotatable about the axis 20. Additionally, the horizontal portion 22 of the yoke-type connecting component 14 is rotatably coupled to the floor 18 of the first support component 12 such that the entire assembly of the yoke-type connecting component 14 and the second support component 16 (along with the sensing device 2) is rotatable about the axis 22 in relation to the first support component 12. In some alternate embodiments, the yoke-type connecting component 14 also could have multiple parts that were rotatable or otherwise movable in relation to one another.

As described in further detail below with respect to the other FIGS., the mounting mechanism 10 further includes one or more components (shown figuratively in FIG. 2 by a dashed box 26) that allow for a particular adjustment or adjustments to be made with respect to the relative positions of the first and second support components 12, 16, and thus allow for a particular adjustment or adjustments to be made in terms of the position of the sensing device 2 in relation to the supporting structure 8 and/or other structures/devices as well (such as the light source 6). In particular, in these embodiments, it is envisioned that the adjustments involve rotational adjustments of the first and second support components 12, 16 with respect to one another about the axes 20 and 22, albeit the present invention is further intended to encompass embodiments in which other types of rotational or translational adjustments and movements are also possible (also, in certain embodiments, movement about only one of the axes 20, 22 is possible).

It should additionally be understood that, while in the present embodiment, the axis 20 is a variable axis insofar as the axis can potentially rotate due to rotation of the connecting component 14 about the axis 22, in alternate embodiments the axis 20 would be fixed in relation to the first support component 12 (and/or in some embodiments the axis 22 could be a variable axis). Further, while most of the embodiments of the invention described herein include adjustment component(s) corresponding to the dashed box 26 of FIG. 2, the present invention also encompasses embodiments of mounting mechanisms that lack any specific adjustment component(s) even though the mechanisms do employ other structures such as connecting components that make it possible to vary the relative orientations/positions of different components/structures, e.g., the relative orientations/positions of sensing devices vis-à-vis supporting structures.

Although FIGS. 1 and 2 show a particular exemplary embodiment of a mounting mechanism having particular components of particular shapes and sizes, the characteristics of the mounting mechanism 10 and subsidiary components are only intended to be exemplary and can be varied depending upon the embodiment. Several other exemplary embodiments of mounting mechanisms in accordance with the present invention (but not all such embodiments as come within the scope of the present invention) are shown in and discussed below with respect to the other FIGS. Thus, while the first support component 12 of the mounting mechanism 10 shown in FIGS. 1 and 2 is box-shaped with a transparent (or open) front face 28 to allow for light to pass there through to the sensing device 2, alternate embodiments of mounting mechanisms could employ first support components that took a variety of other shapes. For example, as shown in some of the other FIGS., particularly FIG. 5 et seq., the first support component could take on a cylindrical shape, and further include a circular or "mushroom" flange at one end to facilitate coupling of the first support component to a supporting structure.

Also, in some other embodiments, the first support component need not fully or largely surround the connecting component 14 and second support component 16, but rather could be merely a flange or other smaller structure that merely served as a component by which the connecting component 14 could be coupled to a supporting structure such as the supporting structure 8 (possibly, in a manner that was not fully rigid or fixed, e.g., in a rotatable or slidable manner). Indeed, in certain embodiments, a portion of a yoke such as the horizontal portion 22 could constitute the first support component, with one or both of the vertical portions 24 constituting the connecting component.

Additionally, depending upon the embodiment, the yoke-type connecting component 14 itself could take on a variety of other forms than that shown in FIGS. 1-2. For example, instead of having horizontal and vertical portions 22, 24 that were substantially linear and perpendicular to one another as shown in FIG. 2, other yoke-type connecting components could employ horizontal and vertical portions that were largely or entirely continuous with one another, e.g., that took on the form of one or more semicircular rings. Additionally, while the second support component 16 of FIGS. 1-2 is cylindrical, in other embodiments that component need not take the form of a cylinder. Rather, the second support component also could take on a variety of forms, for example, a ring, a box, or simply one or two support arms that were interposed between the connecting component and the sensing device.

As mentioned above, the first support component 12 serves as a support for the assembly of the connecting component 14, the second support component 16 and the sensing device 2 with respect to the supporting structure 8 on which the entire mounting mechanism 10 (and sensing device) are supported. Typically, the first support component 12 is mounted in a fixed manner with respect to the supporting structure 8, for example, by way of one or more screws, bolts, an adhesive (or Velcro®) or any of a variety of other fastening devices or methodologies, albeit none of these fastening devices are shown explicitly in the FIGS.

Among the various fastening devices or methodologies that could be employed to couple a mounting mechanism to a supporting structure are snap-type features such as those described in U.S. patent application Ser. No. 11/240,175 entitled "Sensor Mounting Structure With Snapping Feature" filed on even date herewith, which is hereby incorporated by reference herein, as well as features involving relative movement between sleeve and housing portions of a mounting mechanism such as those described in U.S. patent application Ser. No. 11/240,033 entitled "Sensor Mounting Structure With Adjustable Swivel-Ball and Panel Mounting Mechanism" filed on even date herewith, which is hereby incorporated by reference herein. Further as mentioned above, in some embodiments the first support component is not entirely fixed in relation to the supporting structure (e.g., the supporting structure 8), but rather is only restricted in some aspect in terms of its movement with respect to the supporting structure. For example, the first support component can in some embodiments be rotatably or slidably coupled with respect to the supporting structure.

The second support component that serves to support the sensing device also can take on a variety of different characteristics depending upon the embodiment. While the embodiment of FIGS. 1-2 involves the coaxial mounting of the sensing device 2 within the second support component 16, in other embodiments the sensing device can be supported by one or more components having other shapes or configurations, for example, one or more arms extending off of the connecting component. The configuration of the second support component in part could depend upon the shape or other characteristics of the sensing device itself. Indeed, in some cases, the sensing device itself could include both sensor componentry (e.g., electronics) and a housing that was itself configured for interfacing a connecting component such as the yoke-type connecting component 14. In such embodiments the housing (or a portion of the housing) of the sensing device could be considered to be the "second support component" as referred to with respect to FIGS. 1-2, with the internal sensor componentry in turn being the "sensing device".

Further, while in the embodiment of FIGS. 1-2 the sensing device 2 is retained within (or otherwise in relation to) the second support component 16 simply by press-fitting the cylindrical sensing device into a complementary cylindrical cavity within the second support component, in alternate embodiments the sensing device could be coupled to the second support component 16 (or other appropriate second support component) through the use of one or more bolts or screws, adhesive (or Velcro®), or one or more other fastening devices or methodologies. Further, in certain embodiments, it is possible that the sensing device could be rotatably or slidably coupled to the second support component in a manner that still allowed for some relative movement between the sensing device and the second support component.

Figure 3:
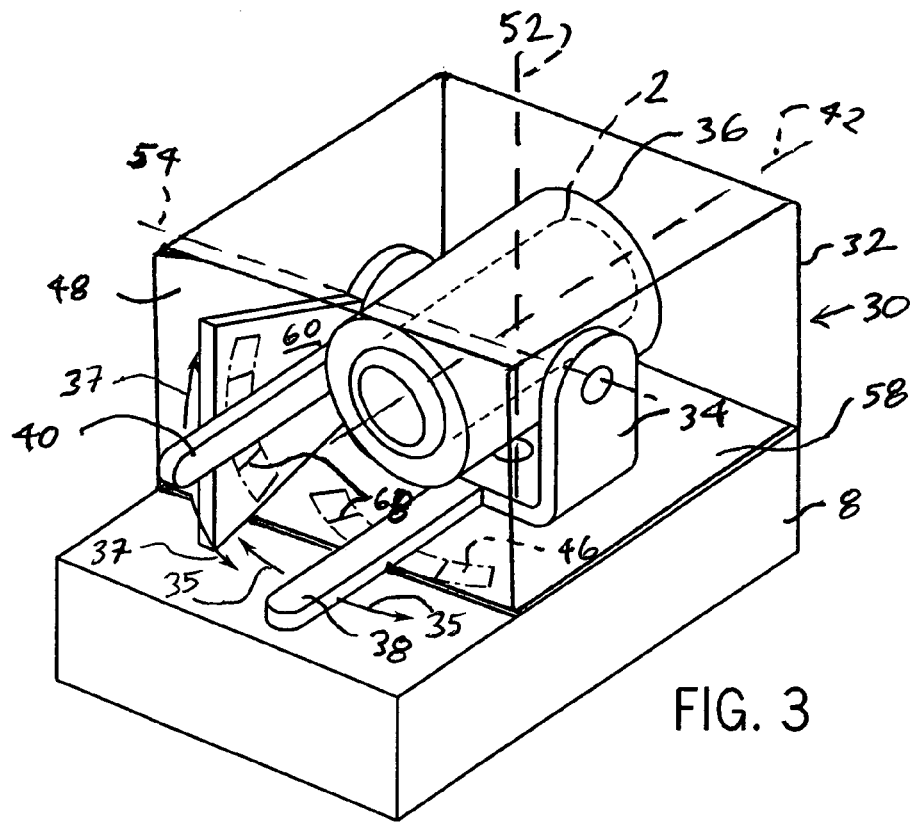
FIG. 3 is a perspective view of another mounting mechanism supporting a sensing device with respect to a supporting structure in accordance with at least one embodiment of the present invention, where the mounting mechanism includes an indicator.

Referring now to FIG. 3, one exemplary version of the mounting mechanism 10 is shown as a mounting mechanism 30. As shown, the mounting mechanism 30 includes a box-shaped first support component 32 that is coupled to the supporting structure 8, and also includes a cylindrically-shaped second support component 36 (within which is positioned the sensing device 2), similar to the first and second support components 12 and 16 of FIG. 2, respectively. Additionally, the second support component 36 is supported in relation to the first support component 32 by way of a yoke-type connecting component 34. The yoke-type connecting component 34 differs slightly from that shown in FIG. 2, insofar as horizontal and vertical portions of the connecting component meet one another at rounded junctions. Nevertheless, as in the case of the connecting component 14 of FIG. 2, the connecting component 34 of FIG. 3 allows for relative rotation of the second support component 36 with respect to the first support component 32 about first and second axes 52 and 54.

Further as shown in FIG. 3, the mounting mechanism 30 also includes first and second levers 38 and 40, respectively, which together correspond to one example (among several described herein) of the adjustment component(s) represented by numeral 26 of FIG. 2. In the embodiment shown, both of the first and second levers 38, 40 extend outward generally parallel to a central axis 42 of the sensing device 2/second support component 36, through a front face 48 of the first support component 32. The first lever 38 is attached to the connecting component 34 and can be actuated in a side-to-side manner along a generally horizontal axis as shown by arrows 35 in FIG. 3, resulting in rotation of the connecting component, the second support component 36 and the sensing device 2 generally about the axis 52. Additionally, the second lever 40 is attached to the second support component 36 and can be actuated in a vertical manner as shown by arrows 37, resulting in rotation of the second support component and the sensing device 2 about the axis 54. Due to the actuation of one or both of the levers 38, 40, the orientation of the first support component 36 and the sensing device 2 supported therewithin can be adjusted in relation to the position of the first support component 32 and the supporting structure 8 that supports the entire mounting mechanism 30.

Although in some embodiments the levers 38 and 40 need not interface any other structure(s) other than the connecting component 34 and the second support component 36, in the present embodiment the levers each are configured to interface with complementary structures. Referring both to FIG. 3 and to FIG. 4, which provides a front elevation view of the mounting mechanism 30 shown in cutaway, in the present embodiment the first lever 38 includes a first tooth 44 protruding downward from the lever that interfaces a first set of complementary recesses 46 extending in an arc along a floor 58 of the first support component 32. The tooth 44 interfaces the recesses 46 (or, in alternate embodiments, a set of teeth or other complementary structure) in a ratcheting manner, such that the rotational position of the connecting component 34, the second support component 36 and the sensing device 2 tends to be set or locked at one of a fixed number of positions depending upon the number of recesses.

Figure 4:
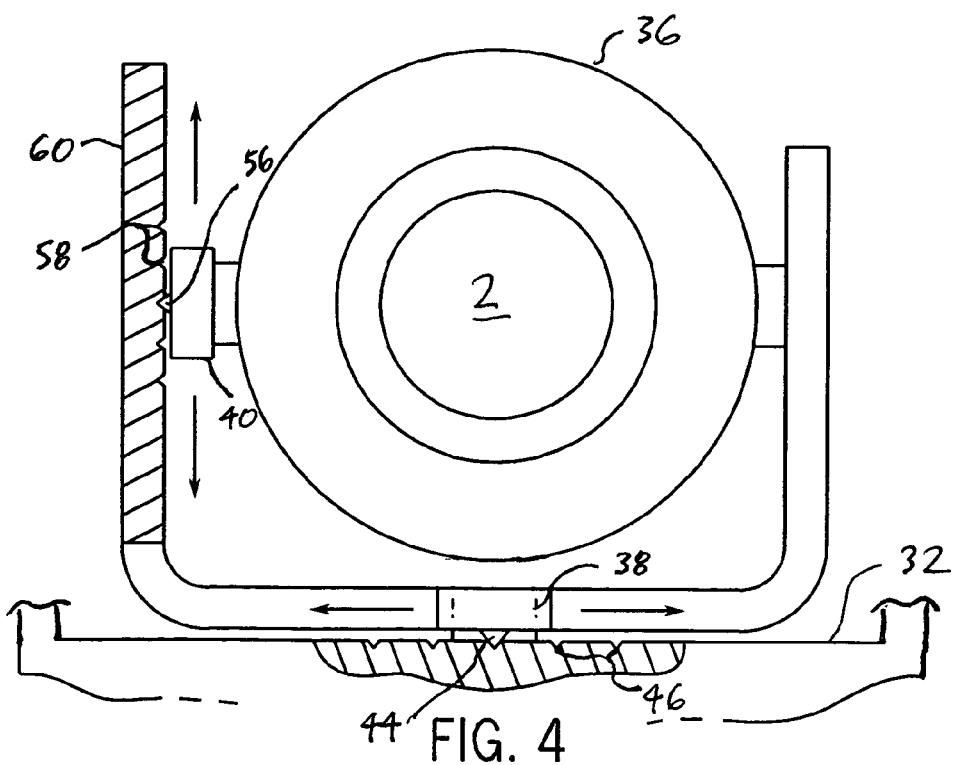
FIG. 4 is a front elevation view of the mounting mechanism (shown in cutaway) and sensing device of FIG. 3.

Likewise, in the present embodiment the second lever 40 has a tooth 56 protruding to the side to interface a set of complementary recesses 58 (or other complementary structure) arranged along an extension 60 of the connecting component 34. Due to the interfacing of the tooth 56 and the complementary recesses 58, the rotation of the second support component 36 and the sensing device 2 with respect to the connecting component 34 about the axis 54 tends to be set or locked in place at particular orientations. Thus, by virtue of the complementary teeth 44, 56 and recesses 46, 58, the orientation of the second support component 36 with respect to the first support component 32 can not only be adjusted about the axes 52, 54 but also can be set (and effectively locked) at particular levels by a person installing the sensing device 2/mounting mechanism 30, and thus the position of the sensing device 2 with respect to the supporting structure 8 can also be set by the person installing the sensing device/mounting mechanism. Although FIG. 4 shows particular shapes of the teeth 44, 56 and the recesses 46, 58, any of a variety of differently-shaped protrusions and/or recesses (or other structures allowing for the setting and/or locking of the position of a lever relative to another structure) could be employed including, for example, protrusions on the floor 58/extension 60 that interacted with one or more recesses on the levers.

Additionally, in at least some embodiments, one or both of the levers 38, 40 and other appropriate component(s) such as the floor 58 of the first support component 32 and/or the extension 60 can be configured so as to provide an indication to a person installing the sensing device/mounting mechanism as to the current orientation of the sensing device. For example, as shown in FIG. 3, a plurality of markings 68 can be placed on each of the floor 58 and the extension 60 along the sets of recesses 46 and 58 that allow the person installing the sensing device to obtain a visual indication of the orientation of the sensing device based upon a comparison of the positions of the levers 38, 40 with respect to the markings 68. The spacing of the recesses 46, 58 with respect to one another can vary depending upon the embodiment. For example, in certain embodiments, each of the recesses could be spaced apart by one degree or by two degrees (or other incremental amount) to allow for one or two degree variations in the orientation of the sensing device 2.

Further, although not shown, in some embodiments other markings can be placed on various components to facilitate determinations as to the orientation of the lever(s) and the sensing device. For example, in some embodiments an arc-shaped slot is created in a sidewall of the first support component (or other wall or component). Markings (for example, indications of a number of degrees off of a horizontal) are further printed on an external side of the support component alongside the slot. Further, the lever (e.g., the lever 40) positioned inside the first support component is provided with a protruding arrow or other marking that is visible from the outside of the first support component through the slot, such that a visual indication is observable from outside the support component as to the level of the lever inside the support component, simply by a visual comparison of the protruding arrow (or other marking) relative to the markings alongside the arc-shaped slot.

Figures 5, 6:
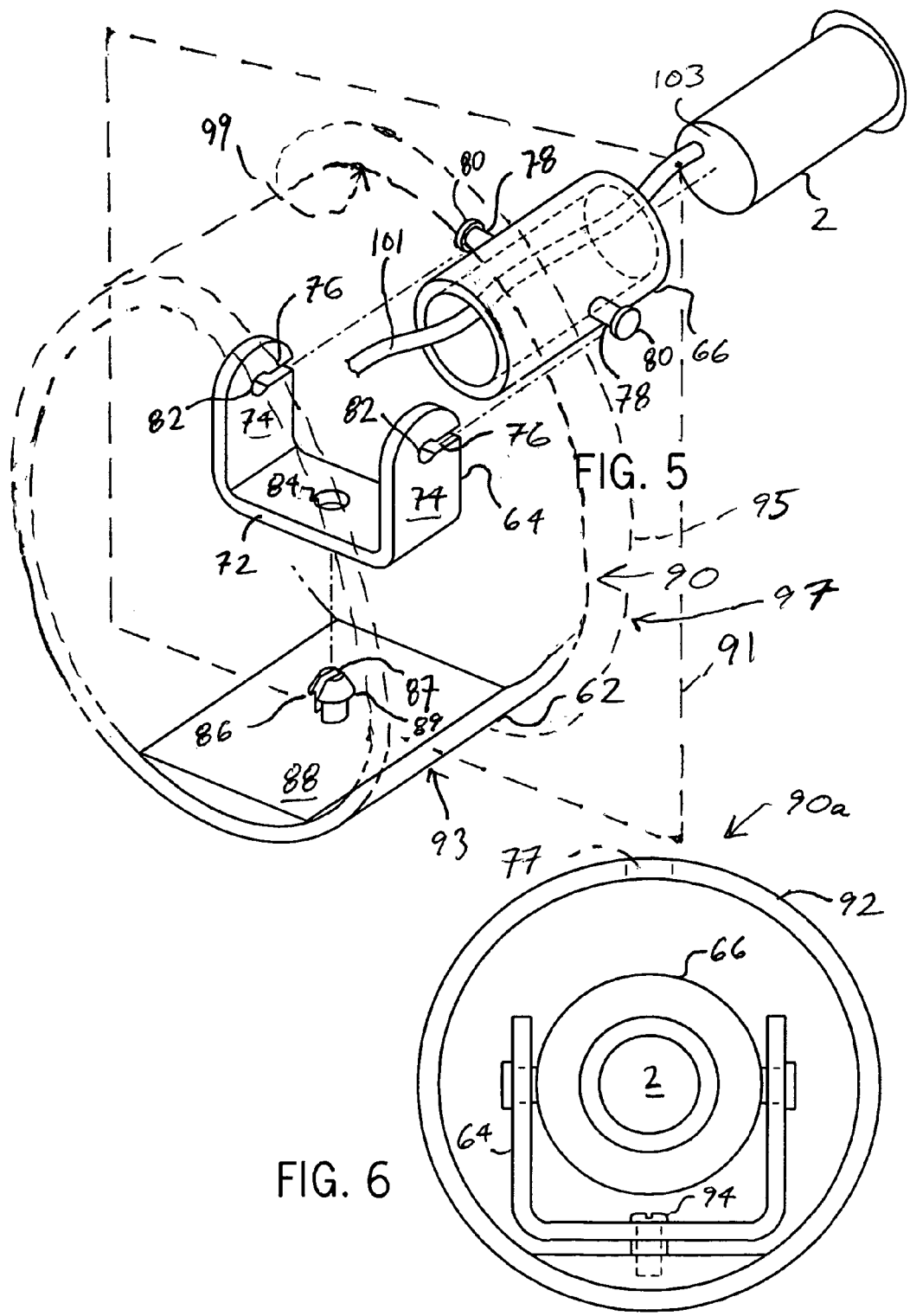
FIG. 5 is a perspective, exploded view of another mounting mechanism (a portion of which is shown in phantom) that is capable of supporting a sensing device with respect to another supporting structure (also shown in phantom) in accordance with at least one embodiment of the present invention.
FIG. 6 is a front elevation view of the mounting mechanism and sensing device of FIG. 5 when assembled with one another, with a circular or "mushroom" flange of the mounting mechanism not shown.

Turning to FIGS. 5-13, additional exemplary embodiments of mounting mechanisms in accordance with the present invention are shown, along with particular components and methodologies that can be employed to assemble those mounting mechanisms. Referring particularly to FIG. 5, a mounting mechanism 90 including first and second support components 62 and 66 and a connecting component 64 is shown. As with the mounting mechanisms 10, 30 described above, the second support component 66 supports a sensing device 2 in relation to the connecting component 64, while the first support component 62 supports the assembly of the sensing device 2, second support component 66 and connecting component 64 in relation to a supporting structure 91.

Although bearing some resemblance to the support/connecting components discussed above with respect to FIGS. 1-4, it will be recognized that the first and second support components 62, 66 and connecting component 64 in FIG. 5 have a somewhat different design. In particular, in this embodiment, the first support component 62 (shown partly in phantom) is mushroom-shaped insofar as it includes a first, cylindrical stem portion 93 (see also FIG. 6 concerning a related mounting mechanism 90*a*) as well as a circular or "mushroom" flange 95 located at a front end 97 of the first support component. The mushroom-shaped design of the first support component 62 facilitates coupling of the mounting mechanism 90 to the supporting structure 91, which is a flat panel having an orifice 99 capable of receiving the cylindrical stem portion 93. The overall mounting mechanism 90 can be positioned onto the supporting structure 91 when it is such a panel by inserting the mounting mechanism (specifically the cylindrical stem portion 93) through the orifice 99 such that the mushroom flange 95 interfaces the panel (e.g., interfaces a rim of the panel). The mounting mechanism further can be fixed in place relative to the panel in a variety of ways including, for example, through the use of bolts, screws or other various fastening devices (or adhesive or Velcro®), or other coupling mechanisms or features such as those described in the aforementioned two patent applications incorporated by reference herein.

Further, the second support component 66 and connecting component 64, while similar to the second support component 36 and connecting component 34 of FIG. 3, differ in several respects. In particular, the connecting component 34, which has a horizontal portion 72 and two vertical portions 74, has horizontal slots 76 in each of its two vertical portions. The slots 76 are configured to receive complementary posts 78, each having a cap 80, that protrude outwardly from opposite sides of the second support component 66. By sliding the second support component 66 horizontally past and through the connecting component 64 between the vertical portions 76, the posts 78 pass into the slots 76 until they reach central stops 82 within the slots, such that the posts and the entire second support component 66 are rotatably coupled to the connecting component 64.

Also in the embodiment of FIG. 5, the connecting component 64 additionally includes a hole 84 in the horizontal portion 72 that is capable of receiving a snap-fit protrusion 86 extending upward from a floor 88 of the first support component 62. As shown, the snap-fit protrusion 86 is largely mushroom-shaped and includes a slot 87 extending from its top downward towards the floor 88 such that, when the hole 84 within the horizontal portion 72 of the connecting component 64 receives the protrusion, the protrusion fully passes into and through the hole until such time as a top ridge 89 separating upper and lower portions of the snap-fit protrusion 86 passes above the hole 84, at which point the connecting component 64 is rotatably coupled to the first support component 62. The snap fit component 86 should not extend so high as to interfere with movement of the second support component.

Referring additionally to FIG. 6, a front elevation view of a slightly modified version of the mounting mechanism 90 of FIG. 5, in this case referred to as mounting mechanism 90a, is shown without the mushroom flange 95. The mounting mechanism 90a is substantially identical to the mounting mechanism 90 except insofar as a first support component 92 of the mounting mechanism 90a lacks the snap-fit protrusion 86 and instead has an orifice 89 capable of receiving a screw 94, which is used to couple the connecting component 64 to the first support component, and additionally includes an orifice 77 along its top allowing for a screwdriver to be inserted for accessing the screw. Although the mushroom-shaped snap-fit protrusion 86 and screw 94 are shown respectively in FIGS. 5 and 6 to be components by which the connecting component 64 can be coupled to the respective first support component 62, 92, the protrusion and screw are intended merely to be exemplary and it should be understood that many other different types of fastening devices or mechanisms could also be employed. For example, the second support component alternatively could have one of a variety of different fastening or mounting features built onto it including, for example, threads, snaps, dovetails, adhesives, and other fastening devices and mechanisms.

Figure 7:
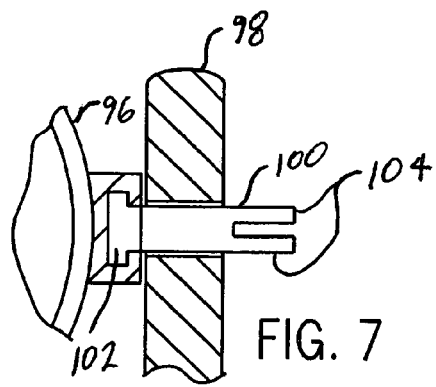
FIGS. 7-13 respectively show a plurality of manners in which a second support component of the mounting mechanism of FIGS. 5 and 6 can be coupled to a connecting component of that mounting mechanism.

Likewise, many different types of fastening devices or mechanisms could be employed in different embodiments to couple the second support component with the connection component 64. In this regard, FIGS. 7-13 show seven different exemplary manners in which a second support component and yoke-type connecting component such as those shown in FIGS. 5-6 (as well as in the other FIGS.) can be rotatably coupled to one another (these techniques are also applicable to the coupling of the first support components with the connecting components). In particular, FIG. 7 shows a further embodiment of second support component 96 and connecting component 98 that are rotatably coupled to one another by way of a pin 100 having a head 102 that is over molded by another portion of the second support component. The pin 100 can be metallic while the remainder of the first support component 96 is plastic. The pin 100 also includes extensions 104 at its end opposite the head 102. The extensions 104 can be swaged over the connecting component 98 so as to prevent (or limit) axial movement of the pin 100 with respect to the connecting component 98.

Figure 8:
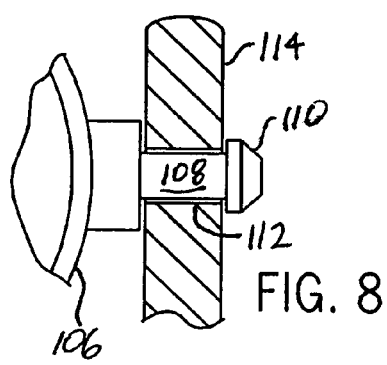
Figure 9:
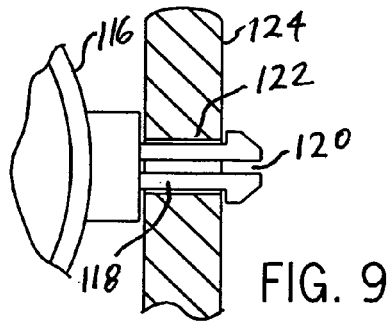

Further exemplary fastening or connecting components are shown in FIGS. 8-13. In contrast to FIG. 7, FIG. 8 shows another embodiment of a second support component 106 having a pin 108 with an enlarged, ramped head. The pin 108 can be pressed through a complementary hole 112 within a connecting component 114 and press fit into place. As for FIG. 9, a further embodiment of a second support component 116 has a mushroom-shaped snap-fit pin 118 similar to the pin 86 of FIG. 5, which includes a slot 120 extending from the tip of the pin along most if not all of its length. Due to the slot 120, the pin 118 can be fit through a complementary hole 122 of a connecting component 124 until the snap-fit pin 118 is snapped into place.

Figure 10:
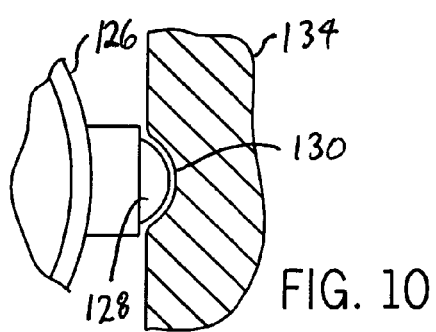
Figure 13:
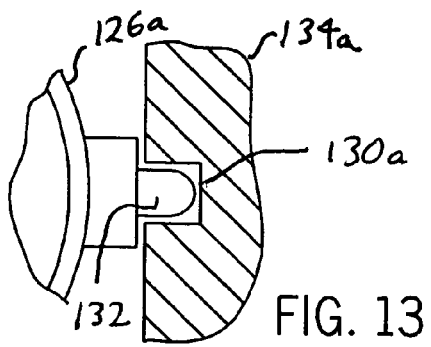

Referring to FIG. 10, in an additional embodiment, a second support component 126 includes a largely spherical bump 128 intended to fit into a complementary recess or dimple 130 within a connecting component 134. FIG. 13 shows a modified version of the embodiment of FIG. 10, in which a modified version of the second support component 126 (shown with reference numeral 126a) has a bump that is elongated so as to constitute a knob 132 that fits within a modified dimple 130a of a modified version of the connecting component 134 (referred to by reference number 134a). Due to the elongated nature of the knob 132 in the embodiment of FIG. 13, insertion of the second support component 126a in relation to the connecting component 134a (e.g., between the two vertical portions of the connecting component) would require greater force than would be used in connection with the embodiment of FIG. 10.

Figure 11:
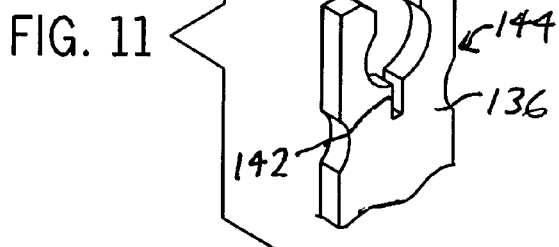
Figure 12:
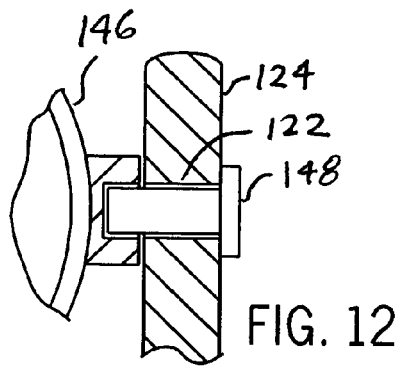

Referring to FIG. 11, another embodiment of a connecting component 144 (shown in cutaway) includes vertical portions 136 each having a slot 138 beginning at a top 140 of the respective vertical portion and extending downward. By appropriately designing the slot 138 and the remainder of the vertical portion 136, for example, by including an additional narrow slot 142 below a bottom of the slot 138, it is possible for the vertical portion 136 to receive a pin 78 (with a head 80), similar to that of FIG. 5, in a snap or press-fit manner. Additionally, as shown in FIG. 12, a further embodiment of a second support component 146 is rotatably coupled in relation to the connecting component 124 (e.g., the same connecting component as in FIG. 9) through the use of a heat stake 148 inserted through the hole 122.

Referring again to FIG. 5, the mounting mechanism 90 is shown in an exploded form in order to illustrate an exemplary manner of assembling the mounting mechanism, either by itself or in relation to the supporting structure 91. As shown in FIG. 5, the sensing device 2 includes a cable 101 such as a signal or power cable that extends, in this example, from a rear surface 103 of the sensing device. Although such a cable will not always be present, in embodiments such as that of FIG. 5 a person installing the sensing device 2 and mounting mechanism 90 can assemble the sensing device to the second support component 66 simply by pulling the cable 101 through and away from the second support component until the sensing device 2 becomes lodged there within. Then, by further pulling on the cable 101, the sensing device with its posts 78 can become fitted into the slots 76, ultimately at the stops 82.

Additionally, although in FIG. 5 the first support component 90 is already assembled to the supporting structure 91, in some circumstances where the aforementioned steps were performed prior to the assembly of the first support component to the supporting structure, the aforementioned steps could be followed by further pulling on the cable 101 so as to pull the cylindrical stem portion 93 of the mounting mechanism 90 through the orifice 99 until the mushroom flange 95 reached the supporting structure 91. Further, once the entire assembly of the sensing device 2, the second support component 66, the connecting component 64 and the first support component 62 is formed and mounted upon the supporting structure 91, the rotational orientation of the support component 66 and sensing device 2 can be set by appropriately moving (e.g., pulling on) the cable 101. In such case, the cable 101 itself can be considered as serving as a form of adjustment component.

Turning to FIGS. 14-28, numerous additional embodiments of mounting mechanisms employing first support components, second support components and connecting components (with the exception of FIG. 15) resembling those of FIGS. 5-6 are shown, where the mounting mechanisms additionally include various different types of adjustment components. With respect to FIG. 14 in particular, a rear perspective view is provided of a further embodiment of a mounting mechanism 150. In this embodiment, the mounting mechanism 150 includes a first support component 152 that, in addition to having a mushroom flange 174, also is generally cylindrical albeit with a cross-section that is not fully circular. The mounting mechanism 150 further includes a second support component 156 that is cylindrical, within which is positioned the sensing device 2. Additionally, the second support component 156 is supported with respect to the first support component 152 by way of a yoke-type connecting component 154.

In addition to having the yoke-type connecting component 154 to support the second support component 156 with respect to the first support component 152, and to allow rotation of the second support component with respect to the first support component about two perpendicular axes, the mounting mechanism 150 further encompasses several additional components that together correspond to the dashed box 26 shown in FIG. 2. In particular, as shown, first and second compression springs 158 and 160 are located at a first end 162 of the second support component 156, with the first compression spring 158 being coupled to extend in a horizontal manner between an internal side of the first support component 152 and an external side of the second support component 156, and with the second compression spring 160 being coupled vertically between a top exterior surface of the second support component and a top interior surface of the first support component. Although not shown in FIG. 14, the second support component 156 (as well as the first support component 152) can be formed to include pockets on its sides to receive the compression springs 158, 160. Such pockets could be, for example, annular formations having cylindrical cavities extending outward from the sides of the support components, into which the compression springs would extend.

Also located proximate the first end 162 of the second support component 156 are first and second set screws 164 and 166, respectively. The first set screw 164 protrudes through a side of the first support component 152 that is opposite to the side that is in contact with the first compression spring 158, and extends inward toward a first flat side surface 168 of the second support component 156. Rotation of the first set screw 164 causes the set screw to move inward or outward relative to the first support component 152, and as a result also causes the flat surface 168 to be pressed toward or released away from the first compression spring 158. Similarly, the second set screw 166 upon rotation moves upward or downward into or outward from the first support component 156 and, as it does so, causes a second interior flat surface 170 of the second support component 156 to be pressed toward or released away from the second compression spring 160. Thus, the compression springs 158 and 160 tend to counteract the forces applied by the set screws 164 and 166, respectively.

Because the springs 158, 160 and set screws 166, 164 act in relation to the first end 162 of the second support component 156, and because the yoke-type connecting component 154 is located away from the first end 162 and is actually closer to a second (opposite) end 172 of the second support component 156, rotation of the set screws 164, 166 causes controlled adjustments in the rotational position of the second support component 156 in relation to the first support component 152 about two axes. Further, such adjustment of the set screws 164, 166 causes controlled adjustments in the relative rotational orientation of the sensing device 2 relative to the supporting structure, which in this embodiment is a panel-type supporting structure (not shown) as described with reference to FIG. 5. Additionally, because of the relatively significant amount of torque that is applied to rotate the set screws 164, 166, adjustment of the set screws 164, 166 largely sets or locks the relative positions of the first and second support components/sensing device/supporting structure.

It should be noted that the amount of variation in the position of the second support component with respect to the first support component that occurs in response to adjustments in the set screws (or other adjustment componentry) depends in part upon how the axial location of those set screws (or other adjustment componentry) along the second support component compares to the axial location of the connecting component along the second support component. For example, a greatest amount of rotational movement of the second end 172 of the second support component 156 of FIG. 14 with respect to the first support component 152 (and of a corresponding end of the sensing device 2 relative to the supporting structure) could be achieved if the set screws 164, 166 operated upon the first end 162 of the second support component and the yoke-type connecting component 154 also was mounted very close to (but not at) that end.

Turning to FIG. 15, a front elevation view of an alternate embodiment of the mounting mechanism 150 of FIG. 14, referred to in this case as a mounting mechanism 150a, is shown. In this embodiment, a second support component 156a is supported with respect to a first support component 152a (which is shown without a mushroom flange corresponding to the flange 174 of FIG. 14) by a different type of connecting component than a yoke-type connecting component. More specifically, instead of a yoke-type connecting component, the mounting mechanism 150a employs four compression springs 176 that together form a spring-type connecting component 178. Each of the compression springs 176 can be mounted (as discussed above with respect to the compression springs 158, 160 of FIG. 14) between the interior surface of the first support component 152a and the exterior surface of the second support component 156a by way of respective pairs of annular pockets 180 formed on those surfaces. Since the spring-type connecting component 178 constitutes an alternate form of connecting component, the spring-type connecting component can be utilized in place of the yoke-type connecting component of FIG. 14 in conjunction with the set screws 164, 166 and compression springs 158, 160, as well as in place of the yoke-type connecting components employed in the other embodiments of mounting mechanisms described herein.

Turning to FIGS. 16 and 17, the compression springs 158 and 160 of the mounting mechanism 150 of FIG. 14 as well as the compression springs 176 of FIG. 15 can be replaced, in alternate embodiments, with leaf springs. In particular as shown in FIG. 16, a mounting mechanism 150b includes a first support component 152b having first and second integrally molded leaf springs 182 and 184, respectively, that at first extend radially inward into the first support component and then, as they proceed inward, generally turn outward again. A second support component 156b is cylindrical along most of its length but at the end that is visible in the view provided by FIG. 16 (corresponding to the first end 162 of FIG. 14) includes a square or rectangular outer surface 186. As shown, the leaf springs 182, 184 are curved in a convex manner relative to the sides of the outer surface 186 so as to tangentially interface two of the sides of that outer surface.

Due to their convex curvature (and presumed spring-like elasticity), the leaf springs 182 and 184 apply first and second inward pressures upon the outer surface 186 as indicated by first and second arrows 188 and 190, respectively, so as to counteract other forces represented by third and fourth arrows 194 and 192, respectively, that can be provided by other components. Thus, the leaf springs 182, 184 can serve the same purpose as the compression springs 158, 160 of FIG. 14, that is, the leaf springs can provide pressure to counteract forces applied by set screws such as the set screws 164 or 166 (or other adjustment components), which are not shown in FIG. 16. Likewise, assuming that two more leaf springs (or other spring components such as two of the compression springs 176) are provided to interface the other sides of the outer surface 186, the leaf springs 182, 184 can also serve as part of a spring-type connecting component such as the connecting component 178 of FIG. 15 (in this case, the axial location of the leaf springs could correspond to the location of the yoke-type connecting component of FIG. 14 rather than to the location of the compression springs 156, 158).

Referring to FIG. 17, a further mounting mechanism 150c is shown that is substantially identical to the mounting mechanism 150b of FIG. 16 except insofar as the mounting mechanism 150c employs a pair of leaf springs 196 that are formed as a separate component relative to a first support component 152c of the mounting mechanism, rather than being formed integrally therewith as in FIG. 16. As shown, in the present embodiment, the leaf springs 196 join one another at a base portion 198 that fits within a complementary slot within the support component 152c. Depending upon the embodiment, the leaf springs of FIG. 17 could also be held in place relative to the support component 152c by way of snaps, adhesives, fasteners, welding, and other fastening devices or mechanisms. Keeping the leaf springs 196 as a separate component relative to the first support component 152c is advantageous relative to the embodiment of FIG. 16 in cases where it is desired to have leaf springs made from a material that is more elastic/flexible than the material out of which the first support component is made.

Although in many embodiments the first support component (and, indeed, each of the first support component, second support component, connecting component and even portions of the adjusting componentry) is made from one or more types of plastic that have some elasticity, in other embodiments the first support component (or any of the components) can be made from other materials (e.g., aluminum, another metal, or another type of plastic) that lack an elasticity appropriate for the leaf springs. Also, in some embodiments leaf springs such as those shown in FIGS. 16 and 17 could also or alternatively be mounted on the second support component so as to interface the first support component. Additionally, while the rectangular outer section 186 is shown in FIGS. 16 and 17, the second support component could be configured in other manners than that shown in order to interface the leaf springs. For example, the second support component could have an interfacing portion having a width dimension that was larger than the diameter of the cylindrical portion of the second support component.

Turning to FIGS. 18 and 19, an additional embodiment of a mounting mechanism 200 is shown, first by way of a rear elevation view in FIG. 18 and then by way of a top plan view with a portion of the mounting mechanism cut away in FIG. 19. As shown in FIGS. 18 and 19, like the mounting mechanism 150 of FIG. 14, the mounting mechanism 200 includes a first support component 202 (a mushroom flange corresponding to the flange 174 of FIG. 14 not being shown), a yoke-type connecting component 204, and a second support component 206 within which is supported a sensing device 2. Additionally, first and second compression springs 208 and 210 corresponding to the compression springs 158 and 160 of FIG. 14 are positioned between the exterior of the second support component 206 and the interior of the first support component 202.

Instead of employing the set screws 164, 166 and flat surfaces 168, 170 of the mounting mechanism 150 of FIG. 14, however, the mounting mechanism 200 employs different adjusting components. In particular, the mounting mechanism 200 includes first and second knobs 212 and 214 that are rotatably coupled to the first support component 202. The first and second knobs 212, 214 have respective first and second push rods 216 and 218, which also can be termed offset posts or extensions, that extend inward from the first support component 202 towards the second support component 206. As shown, the first and second push rods 216, 218 extend in directions that are substantially parallel to axes of rotation of the respective knobs 212, 214, but which are radially offset somewhat from those axes of rotation such that, when the knobs are rotated, the push rods follow arc-shaped paths (actually, circularly-shaped paths if one turns the knobs 360 degrees around).

Further as shown, the second support component 206 additionally includes first and second extensions 220 and 222, respectively, that serve as contact surfaces for interfacing the push rods 216 and 218, respectively. Consequently, when the first knob 212 is rotated, the first push rod 216 that is interfacing the first extension 220 moves so as to increase or reduce a force represented by arrow 224 that tends to counteract a force represented by arrow 226 provided by the compression spring 210. Similarly, when the knob 214 is rotated, the push rod 218 interfacing the extension 222 tends to increase or reduce a force represented by an arrow 228 that is counteracted by a force represented by an arrow 230 provided by the compression spring 208. In this manner, depending upon the setting of the knobs 212, 214, the first support component 206 can be rotated about first and second axes 232 and 234, respectively (see FIG. 19), which correspond to the axes 22 and 24 discussed with reference to FIG. 2. Additionally, depending upon the degree to which the knobs 212, 214 are allowed to rotate freely with respect to the first support component 202 (e.g., the amount of friction between the knobs and the first support component), the setting of a particular rotational position of each of the knobs can effectively set or lock the orientation of the second support component 206 in relation to the first support component 202.

Although the knobs 212, 214 with their push rods 216, 218 can be assembled onto the first support component 202 in a number of ways, in at least some embodiments the knobs 212, 214 are slid into slots formed within the first support component that are similar or identical to the slots 76 shown in FIG. 5 or the slot 138 of FIG. 11, such that the knobs are retained in relation to the first support component and also rotatable in relation thereto. In other embodiments, the first support component 202 has complementary orifices to receive the knobs. In some such embodiments, including the present embodiment as shown in FIG. 19, these orifices are oblong or keyed orifices 236, which are configured to receive the push rods 216, 218 of the knobs 212, 214 along with certain oblong portions 237 of the knobs from which the push rods extend. The keyed orifices 236 are arranged such that the push rods 216, 218 and oblong portions 237 of the knobs 212, 214 can be inserted through the orifices, after which the knobs are rotated (e.g., by 90 degrees as shown or alternatively by 180 degrees) to prevent the push rods and oblong portions from falling back out. Preferably, the knobs 212, 214 are rotated to allow the push rods 216, 218 to attain a minimum sweep of plus or minus five degrees.

Turning to FIGS. 20 and 21, an additional mounting mechanism 240 is shown to include a first support component 242, a yoke-type connecting component 244, and a second support component 246, within which is positioned the sensing device 2. As in the case of the mounting mechanism 200 of FIGS. 18 and 19, the mounting mechanism 240 of FIGS. 20 and 21 includes first and second compression springs 248 and 250 extending between the first and second support components 242 and 246. However, in contrast to the knobs 212, 214 with push rods 216, 218 shown in FIGS. 18 and 19, the mounting mechanism 240 instead includes first and second knobs 252 and 254, respectively, that include first and second cams 256 and 258, respectively. The cams 256 and 258 respectively interface first and second posts 260 and 262, respectively, that extend outward from the second support component 246. As the first and second knobs 252, 254 are rotated, the first and second cams 256, 258 also rotate so as to increase or decrease first and second forces represented by first and second arrows 268 and 264 applied against the posts, which tend to counteract forces generated by the compression springs 248, 250 represented by arrows 270 and 266, respectively.

Thus, depending upon the rotation of the knobs 252 and 254, the second support component 246 can be rotated relative to the first support component 242 about each of first and second axes 272 and 274 (see FIG. 21), which correspond to axes 232, 234, 22 and 24 discussed above. Further, if the knobs 212, 214 are held sufficiently tightly in place relative to the first support component 242 to prevent unintended rotation of the knobs, setting of the knobs to a particular position can effectively set and lock the rotational orientation of the second support component 246 in relation to the first support component. As in the case of the knobs 212, 214 of the mounting mechanism 200, the knobs 252, 254 with their cams 256, 258 can be snapped into place with respect to the first support component 242 given appropriate slots formed within that component or alternatively can be inserted into place by passing the cams through appropriate keyed orifices (not shown) formed within the wall of the first support component and then rotating the knobs.

Referring to FIG. 22, a rear elevation view of an additional mounting mechanism 280 is shown. As with the mounting mechanism 240, the mounting mechanism 280 includes a first support component 282, a yoke-type connecting component 284, and a second support component 286, within which is supported the sensing device 2. Additionally, the mounting mechanism 280 is shown to include the same first and second compression springs 248, 250 as are employed in the mounting mechanism 240. While the mounting mechanism 280 also includes first and second knobs 288 and 290, which include first and second cam portions 292 and 294, respectively, the cam portions 292, 294 are configured differently than the cam portions 256, 258 of the mounting mechanism 240. Although the cam portions 292, 294 also respectively interface first and second posts 296 and 298 extending outward from the second support component 286, the cam portions interact with those posts in a different manner than the cam portions 256, 258 interact with the posts 260, 262 of the mounting mechanism 240.

In particular, the cam portions 292, 294 are ramp-type cam portions where the effective length of the cam portions (e.g., the length of the cam portion extending between the first support component and the respective post 296 or 298) varies axially as the respective knobs 288, 290 are rotated. Consequently, rotation of the knob 288 and corresponding cam portion 292 tends to increase or decrease an axial pressure applied along the post 296 rather than a side-to-side pressure as was applied to the post 260 by the corresponding cam 256 of the mounting mechanism 240. Likewise, rotation of the knob 290 and corresponding cam portion 294 tends to apply an axial pressure upon the post 298 rather than a side-to-side pressure as was applied to the post 262 by the cam 258 in the mounting mechanism 240. Although the forces applied by the cam portions 292, 294 in relation to the second support component 286 are consequently reversed relative to the forces that are applied by the cam portions 256, 258 of the mounting mechanism 240, the cam portions 292, 294 nonetheless are capable of applying forces represented by arrows 276 that tend to counteract forces applied by the first and second compression springs 248, 250, which are represented by arrows 278. Consequently, the cam portions 292, 294 are able to rotate the second support component 286 relative to the support component 282 about both of the two axes described earlier.

As was described with respect to the mounting mechanism 150 of FIG. 14, the present embodiments of the mounting mechanisms 200, 240, 280 are configured to be mounted onto a panel-type supporting structure by way of inserting the entire mechanism (e.g., the cylindrical portion of the first support component) through an orifice within the supporting structure up until a mushroom flange (see FIG. 14) abuts the supporting structure. In such embodiments, the set screws 164, 166 and/or knobs 212, 214, 252, 254, 288, 290 can be assembled upon the respective mounting mechanism after the remainder of the mounting mechanism has already been mounted onto the panel-type supporting structure. Alternatively, the set screws and/or knobs can be partially recessed into the first support component such that the set screws/knobs would not prevent effective insertion of the mounting mechanism through the orifice within the supporting structure.

Turning to FIG. 23, a top plan view is provided of a further embodiment of a mounting mechanism 300, with a top portion of a first support component 302 of the mounting mechanism cutaway. As shown, the mounting mechanism 300 includes the first support component 302, a yoke-type connecting component 304, and a second support component 306, and further employs the first and second compression springs 248 and 250 of FIGS. 20-22. However, instead of including knobs with cam portions as discussed with respect to those FIGS., the mounting mechanism 300 includes first and second ramps 308 and 310, which have first and second sloped surfaces 312 and 314, respectively, that engage a first end 316 of the second support component 306. The first and second ramps 308 and 310 respectively slide along first and second slideways 318 and 320 formed as part of the first support component 302. The ramps 308, 310 include under portions (e.g., beneath the sloped surfaces 312, 314) that have a T-shaped cross-section and that slide within complementary C-shaped slots within the slideways 318, 320, such that the ramps are prevented from disengaging from the slideways.

The relative positioning of the ramps 308, 310 in relation to the first and second support components 302 and 306 is determined by the interaction of the ramps with the second support component, with first and second set screws 322 and 324 and with additional springs 326 and 328 that apply forces to the ramps. More particularly, the springs 326, 328 are respectively situated within the slideways 318, 320 and apply forces against inner ends 330 of the respective ramps 308, 310 tending to force the ramps outward away from the second support component 306. In contrast, the set screws 322, 324 apply forces to outer ends 332 of the respective ramps 308, 310 tending to counteract the forces of the respective springs 326, 328. By appropriately rotating the set screws 322, 324, the respective ramps 308, 310 can be moved to different locations within the respective slideways 318, 320 and with respect to the second support component 306, which in turns results in rotation of the second support component in relation to the first support component 302. More particularly, movement of the first ramp 308 due to rotation of the set screw 322 tends to increase or decrease a force represented by an arrow 334 tending to counteract a force provided the first compression spring 248, which is represented by an arrow 336. Similarly, rotation of the set screw 324 moves the second ramp 310, tending to increase or decrease a force that is counteracted by a force supplied by the compression spring 250.

Referring to FIG. 24, a modified version of the mounting mechanism 300, which is shown as a mounting mechanism 300a, also employs the ramps 308, 310 (for clarity, a side view of the mounting mechanism 300a is provided in which only the compression spring 250 and the ramp 310 are shown). Further, while the second support component 306 and the yoke-type connecting component 304 are the same as those shown in FIG. 23 with respect to the mounting mechanism 300, the first support component (shown as 302a), employs a slideway 320a that differs from the slideway 320 of the mounting mechanism 300. As shown, the slideway 320a is slightly elongated in comparison with the slideway 320, and includes an extension 338 on which is mounted a rotatable cam 340 that is similar to the cams 256, 258 shown in FIGS. 20 and 21.

Depending upon rotation of the cam 340 (which in the present embodiment is finger-actuatable), the ramp 310 is moved farther inward or allowed to come farther outward in relation to the second support component 306, with the ramp 310 being pressed outward again generally by way of the spring 328 within the slideway 320a. Thus, depending upon the orientation of the cam 340, an increased or decreased amount of force represented by an arrow 342 is applied by the ramp 310 in relation to the second support component 306 that tends to counteract a force 344 applied by the compression spring 250, and consequently rotation of the second support component represented by an arrow 307 can be achieved. Although not shown, it should be understood that the mounting mechanism 300a in the present embodiment includes a second slideway with a second extension and cam as well as the spring 326, for supporting the ramp 308 and allowing adjustment of the orientation of the second support component 306 about a second axis perpendicular to a first axis about which the motion represented by the arrow 307 occurs.

Although in the embodiments of FIGS. 23 and 24 the ramps 308, 310 are supported primarily on the first support components 302, 302a, in alternate embodiments, one or more ramps could alternatively or also be mounted on the second support component 306 or on the connecting component 304. Also although not shown, the cam 340 shown in FIG. 24 could have ridges or other surfaces along its perimeter that would facilitate actuation of the cam due to rotational pressure applied by a person's finger.

Turning to FIGS. 25 and 26, side elevation and top views of an additional embodiment of a mounting mechanism 350 are shown. The mounting mechanism 350 includes a first support component 352, which in FIGS. 25 and 26 is shown to be mostly cut away and which can take the form of a cylindrical structure (or mushroom-shaped structure as described above). Also, the mounting mechanism 350 includes a yoke-type connecting component 354, and a second support component 356 (shown in phantom in FIG. 26), on which is supported the sensing device 2 (shown in phantom in FIG. 25). As shown best in FIG. 26, the connecting component 354 and second support component 356 are capable of rotational movement about a first axis 346. Proximate a base 355 of the yoke-type connecting component 354, a gear 358 is fixed in relation to the connecting component. Additionally, interfacing the gear 358 is a second gear 360 that is rotatably coupled to a floor 362 of the first support component 352. User actuation of the second gear 360, which in the present embodiment has a smaller diameter than the gear 358 and a side that is proximate a first end 361 of the first support component 352 to facilitate user access, causes corresponding rotation of the gear 358 and thus rotation of the connecting component 354 and the second support component 356 about the first axis 346.

In addition to the gears 358, 360, the mounting mechanism 350 has additional adjusting componentry that allows for adjustment of the rotational position of the second support component 356 about a second axis 348 that is perpendicular to the first axis 346. More particularly, the connecting component 354 includes an extension 364 that extends outward beyond the second support component 356, and on which is mounted a third gear 366. The third gear 366, which has a side that is located proximate the first end 361, interfaces complementary gear teeth 368 that are formed on an end 370 of the second support component 356. Consequently, user actuation of the third gear 366 results in corresponding rotation of the second support component 356 about the second axis 348. Thus, by appropriate rotation of the gears 360 and 366, the rotational orientation of the second support component 356 in relation to the first support component 352 (and thus of the sensing device 2 in relation to a supporting structure on which the entire assembly is mounted) can be achieved about two axes. Additionally, if the gears are mounted in a manner such that significant torque is required to rotate the gears, rotation of the gears can effectively set and lock the position of the second support component. Also, in alternative embodiments, additional gear locking components such as locking pawls or latches could be implemented so as to set and lock the rotational position of the gears and the second support component.

Referring further to FIGS. 27 and 28, side elevation and top views of a modified version of the mounting mechanism 350, shown as a mounting mechanism 350a, are shown. A first support component 352a of the mounting mechanism 350 is shown largely cut away. The mounting mechanism 350*a* has the same second support component 356 (for supporting the sensing device 2) as the mounting mechanism 350, and also utilizes the same gear 366 and gear teeth 368 as that mounting mechanism, in order to adjust the orientation of the second support component about a first axis 348*a*. However, the gear 360 of the mounting mechanism 350*a* (which also is the same as the gear used in the mounting mechanism 350) does not interface the gear 358, but instead merely interfaces a set of gear teeth 370 extending along an arc 372 formed along a bottom portion 374 of an extension 364*a* of a yoke-type connecting component 354*a*. User actuation of the gear 360 in the mounting mechanism 350*a*, as in the case of the mounting mechanism 350, causes rotation of the connecting component 354*a* about the axis 346 and thus causes rotation of the second support component (and sensing device) about that axis. However, because the mounting mechanism 350*a* includes as part of its adjusting componentry only the teeth 370 rather than the entire gear 358, the overall width of the first support component 352*a* is (albeit need not be) reduced in comparison with the first support component 352 since the entire diameter of the gear 358 need not be accommodated.

The embodiments of mounting mechanisms shown in the above-described FIGS. are intended only to be exemplary of a wide variety of embodiments that are encompassed by the present invention. Various features shown above can be combined in manners that are different from those shown to achieve a variety of other embodiments of mounting mechanisms that are encompassed by the present invention. For example, while FIG. 15 shows that the yoke-type connecting component 154 of the mounting mechanism 150 of FIG. 14 could in some embodiments be entirely replaced with a set of four (or potentially less than or more than four) compression springs, many of the other embodiments discussed herein including yoke-type connecting components could likewise be modified in ways that eliminated the yoke-type connecting components and instead employed compression springs in order to connect the first and second support components. Also, to the extent that FIGS. 16 and 17 show the use of two leaf springs to apply force to the second support components shown in those FIGS, again potentially four leaf springs (or less than or more than four) or some combination of leaf springs and compression springs or other connecting components could be employed in place of yoke-type connecting components.

Additionally, the present invention is intended to encompass a wide variety of sensor mounting structures having a variety of components, including components not discussed in detail herein. For example, the present invention can include embodiments of mounting mechanisms that also include light pipes, as described in U.S. Pat. Application Ser. No. 11/240,019 entitled "Sensor Mounting Structure With Light Pipe" filed on even date herewith, which is hereby incorporated by reference herein. Although the above-described embodiments of the invention include a variety of different types of adjustment componentry for adjusting, setting, locking, and/or indicating the orientation of a second support component in relation to a first support component (and/or a sensing device in relation to a supporting structure), the present invention is also intended to encompass mounting structures that do not have such adjustment componentry but rather merely have one or more of the features described herein.

Further, while all or nearly all of the embodiments discussed above include second support components within which (or on which) sensing devices are supported, the present invention is also intended to encompass embodiments in which the sensing devices are integrally formed with or as part of the second support components. For example, in some embodiments, a sensing device will have a housing that can adequately serve not only to contain the internal sensing componentry (e.g., the electronics) but also to interface with connecting components such as the yoke-type connecting components and spring-type connecting components discussed above. Additionally, it should be noted that the first support component in some embodiments can be one or more components that are conventionally integrated with (or viewed as being part of) the larger system in which the sensing device is being implemented, e.g., one or more components that are conventionally integrated with a supporting structure of a larger system. Thus, the present invention is intended to encompass embodiments in which a connecting component is configured to be coupled to a support component that conventionally is integrated with (or viewed as being part of) a supporting structure. Further, the present invention is intended to encompass embodiments in which a support component is only indirectly coupled to a supporting structure of a larger system.

It is specifically intended that the present invention not be limited to the embodiments and illustrations contained herein, but include modified forms of those embodiments including portions of the embodiments and combinations of elements of different embodiments as come within the scope of the following claims.

I claim:

1. A mounting device configured for mounting a sensing device in relation to a supporting structure, the mounting device comprising:
 a first support component capable of being mounted at least indirectly in relation to the supporting structure;
 a second support component configured to support the sensing device;
 a connecting component coupled between the first and second support components, wherein the connecting component supports the second support component in relation to the first support component; and
 an adjustor coupled to at least one of the first support component, the second support component and the connecting component that influences a positioning of the second support component in relation to the first support component;
 wherein the connecting component includes a yoke, wherein the yoke allows for relative rotational movement of the second support component with respect to the first support component about a first axis, and wherein the yoke allows for relative rotational movement of the second support component with respect to the first support component about a second axis.

2. The mounting device of claim 1, wherein at least one of the first support component and the second support component has at least one surface that is at least one of substantially cylindrical and substantially flat.

3. The mounting device of claim 2, wherein each of the first and second support components has a shape that is substantially like that of at least one of a barrel, a ring and a rectangular box.

4. The mounting device of claim 2, wherein each of the first and second support components has at least one surface that is substantially cylindrical.

5. The mounting device of claim 1, wherein the first axis is perpendicular to a central axis of at least one of the first and second support components.

6. The mounting device of claim 1, wherein at least one of the second support component and the connecting component includes a protrusion that is capable of being received into a complementary indentation on at least one of the first support component, the connecting component and the supporting structure.

7. The mounting device of claim 1, further comprising an indicator that provides an indication of a positioning of the second support component in relation to at least one of the first support component and the supporting structure.

8. The mounting device of claim 1, wherein the connecting component includes at least one spring extending between the first and second support components.

9. The mounting device of claim 1, wherein the adjustor includes at least one of a first gear, a first push rod, a first cam, and a first ramp.

10. The mounting device of claim 9, wherein the adjustor includes the first gear, and wherein the first gear interfaces a first complementary gear interface on at least one of the connecting component and the second support component.

11. A conveyor section capable of being implemented as part of an assembly line, wherein the conveyor section includes the mounting device, supporting structure and sensing device of claim 1, and wherein the sensing device is a light-sensing device.

12. An assembly including the mounting device and the sensing device of claim 1, wherein the sensing device is at least one of a light-sensing device, a laser-sensing device, a color-sensing device, a device for sensing at least one of infrared, microwave, and x-ray radiation, a position-sensing device, an acoustic-sensing device, a vibration-sensing device, a motion-sensing device, and an orientation-sensing device.

13. A system including the mounting device, supporting structure and sensing device of claim 1, wherein the system is configured for use in at least one of an industrial environment, a commercial environment, a military environment, and a residential environment.

14. The mounting device of claim 1, wherein the connecting component includes at least one spring extending between the first and second support components, and wherein at least one of the first and second support components includes a pocket to receive the spring.

15. The mounting device of claim 1, wherein the connecting component includes at least one spring extending between the first and second support components, and wherein the adjustor includes at least one set screw that is configured to interface a surface of the second support component.

16. The mounting device of claim 1, wherein the adjustor includes a first gear, wherein the first gear interfaces a first complementary gear interface on at least one of the connecting component and the second support component, and wherein the adjustor includes a second gear and the second gear interfaces a second complementary gear interface on at least one of the connecting component and the second support component.

17. A mounting device configured for mounting a sensing device in relation to a supporting structure, the mounting device comprising:
a first support component capable of being mounted at least indirectly in relation to the supporting structure;
a second support component configured to support the sensing device;
a connecting component coupled between the first and second support components, wherein the connecting component supports the second support component in relation to the first support component; and
an adjustor coupled to at least one of the first support component, the second support component and the connecting component that influences a positioning of the second support component in relation to the first support component;
wherein the connecting component includes a yoke, and wherein the adjustor includes a first protrusion coupled to at least one of the second support component and a portion of the yoke.

18. The mounting device of claim 17, wherein the first protrusion is coupled to the second support component, wherein the adjustor also includes a second protrusion, and wherein the second protrusion is coupled to the at least one portion of the yoke.

19. The mounting device of claim 18, wherein each of the first and second protrusions is a lever, and wherein when the second support component is positioned in a centered manner with respect to the first support component each of the levers extends in a manner that is substantially parallel to a central axis of at least one of the first and second support components.

20. The mounting device of claim 17, wherein the first protrusion serves as an indicator of a level of the second support component in relation to at least one of the first support component, the connecting component and the supporting structure.

21. The mounting device of claim 17, wherein the first protrusion includes at least one of a tooth and an indentation configured to interface a complementary component coupled to at least one of the first support component, the connecting component and the supporting structure.

22. The mounting device of claim 21, wherein the first protrusion includes a single tooth, wherein the complementary component includes a set of recesses, and wherein the single tooth mates in a ratcheting manner with the set of recesses, and wherein the mating of the single tooth with the set of recesses sets a relative positioning of the second support component in relation to at least one of the first support component, the connecting component and the supporting structure.

23. The mounting device of claim 17, wherein the yoke allows for relative rotational movement of the second support component with respect to the first support component about a first axis, and wherein the yoke allows for relative rotational movement of the second support component with respect to the first support component about a second axis.

24. The mounting device of claim 17, wherein the connecting component includes at least one spring extending between the first and second support components.

25. A mounting device configured for mounting a sensing device in relation to a supporting structure, the mounting device comprising:
a first support component capable of being mounted at least indirectly in relation to the supporting structure;
a second support component configured to support the sensing device;
a connecting component coupled between the first and second support components, wherein the connecting component supports the second support component in relation to the first support component; and
an adjustor coupled to at least one of the first support component, the second support component and the connecting component that influences a positioning of the second support component in relation to the first support component;
wherein the connecting component includes at least one spring extending between the first and second support components, and wherein at least one of the first and second support components includes a pocket to receive the spring.

26. The mounting device of claim 25, wherein the spring is at least one of a compression spring and a leaf spring.

27. The mounting device of claim 25, wherein the adjustor includes at least one of a gear, a ramp, a cam, a push rod, and a wire.

28. A mounting device configured for mounting a sensing device in relation to a supporting structure, the mounting device comprising:
a first support component capable of being mounted at least indirectly in relation to the supporting structure;
a second support component configured to support the sensing device;
a connecting component coupled between the first and second support components, wherein the connecting component supports the second support component in relation to the first support component; and
an adjustor coupled to at least one of the first support component, the second support component and the connecting component that influences a positioning of the second support component in relation to the first support component;
wherein the connecting component includes at least one spring extending between the first and second support components, wherein the spring is at least one of a compression spring and a leaf spring, and wherein the spring is the leaf spring and the leaf spring is at least one of formed integrally with the first support structure and coupled to the first support structure by way of a means for coupling.

29. The mounting device of claim 28, wherein the yoke allows for relative rotational movement of the second support component with respect to the first support component about a first axis, and wherein the yoke allows for relative rotational movement of the second support component with respect to the first support component about a second axis.

30. The mounting device of claim 28, wherein at least one of the first support component and the second support component has at least one surface that is at least one of substantially cylindrical and substantially flat.

31. The mounting device of claim 28, further comprising an indicator that provides an indication of a positioning of the second support component in relation to at least one of the first support component and the supporting structure.

32. A mounting device configured for mounting a sensing device in relation to a supporting structure, the mounting device comprising:
a first support component capable of being mounted at least indirectly in relation to the supporting structure;
a second support component configured to support the sensing device;
a connecting component coupled between the first and second support components, wherein the connecting component supports the second support component in relation to the first support component; and
an adjustor coupled to at least one of the first support component, the second support component and the connecting component that influences a positioning of the second support component in relation to the first support component,
wherein the connecting component includes at least one spring extending between the first and second support components, and wherein the adjustor includes at least one set screw that is configured to interface a surface of the second support component.

33. The mounting device of claim 32, wherein the connecting component further includes a yoke, wherein the yoke is coupled to the second support component at a first location along an axial length of the second support component and the surface interfaced by the set screw is located at a second location along the axial length of the second support component, and wherein rotation of the set screw produces rotation of the second support component with respect to the first support component.

34. The mounting device of claim 32, wherein the yoke allows for relative rotational movement of the second support component with respect to the first support component about a first axis, and wherein the yoke allows for relative rotational movement of the second support component with respect to the first support component about a second axis.

35. The mounting device of claim 32, further comprising an indicator that provides an indication of a positioning of the second support component in relation to at least one of the first support component and the supporting structure.

36. A mounting device configured for mounting a sensing device in relation to a supporting structure, the mounting device comprising:
a first support component capable of being mounted at least indirectly in relation to the supporting structure;
a second support component configured to support the sensing device;
a connecting component coupled between the first and second support components, wherein the connecting component supports the second support component in relation to the first support component; and
an adjustor coupled to at least one of the first support component, the second support component and the connecting component that influences a positioning of the second support component in relation to the first support component;
wherein the adjustor includes a first gear, wherein the first gear interfaces a first complementary gear interface on at least one of the connecting component and the second support component, and wherein the adjustor includes a second gear and the second gear interfaces a second complementary gear interface on at least one of the connecting component and the second support component.

37. The mounting device of claim 36, wherein the yoke allows for relative rotational movement of the second support component with respect to the first support component about a first axis, and wherein the yoke allows for relative rotational movement of the second support component with respect to the first support component about a second axis.

38. The mounting device of claim 36, further comprising an indicator that provides an indication of a positioning of the second support component in relation to at least one of the first support component and the supporting structure.

39. A mounting device configured for mounting a sensing device in relation to a supporting structure, the mounting device comprising:
a first support component capable of being mounted at least indirectly in relation to the supporting structure;
a second support component configured to support the sensing device;
a connecting component coupled between the first and second support components, wherein the connecting component supports the second support component in relation to the first support component; and an adjustor coupled to at least one of the first support component, the second support component and the connecting component that influences a positioning of the second support component in relation to the first support component, wherein the adjustor includes a first gear, wherein the first gear interfaces a first complementary gear interface on at least one of the connecting component and the second support component, wherein the connecting component includes a yoke, and wherein the gear interface includes at least one of a plurality of gear teeth extending entirely around a circumference of a circular portion and a plurality of gear teeth extending along a curve that is a portion of a circle.

40. The mounting device of claim 39, wherein the yoke allows for relative rotational movement of the second support component with respect to the first support component about a first axis, and wherein the yoke allows for relative rotational movement of the second support component with respect to the first support component about a second axis.

41. The mounting device of claim 39, further comprising an indicator that provides an indication of a positioning of the second support component in relation to at least one of the first support component and the supporting structure.

42. A mounting device configured for mounting a sensing device in relation to a supporting structure, the mounting device comprising:

a first support component capable of being mounted at least indirectly in relation to the supporting structure;

a second support component configured to support the sensing device;

a connecting component coupled between the first and second support components, wherein the connecting component supports the second support component in relation to the first support component; and an adjustor coupled to at least one of the first support component, the second support component and the connecting component that influences a positioning of the second support component in relation to the first support component;

wherein the adjustor includes a first push rod and also includes a first knob rotatably coupled with respect to the first support component, wherein the first push rod extends in a direction that is substantially parallel to an axis of rotation of the first knob with respect to the first support component, wherein the first push rod is coupled to the first knob at a location offset from the axis of rotation, wherein the first push rod extends from the first knob to interface at least one of the connecting component, the second support component and the sensing device, and wherein rotation of the knob produces movement of at least one of the connecting component, the second support component and the sensing device.

43. The mounting device of claim 42, wherein the first support component includes a keyed orifice, and wherein the knob and push rod are coupled to the first support component by inserting the push rod through the keyed orifice and then rotating the knob.

44. A mounting device configured for mounting a sensing device in relation to a supporting structure, the mounting device comprising:

a first support component capable of being mounted at least indirectly in relation to the supporting structure;

a second support component configured to support the sensing device;

a connecting component coupled between the first and second support components, wherein the connecting component supports the second support component in relation to the first support component; and an adjustor coupled to at least one of the first support component, the second support component and the connecting component that influences a positioning of the second support component in relation to the first support component;

wherein the adjustor includes a first cam and also includes a first knob attached to the first cam and rotatably coupled with respect to the first support component, wherein the cam interfaces a contact surface on at least one of the connecting component, the second support component and the sensing device, and wherein rotation of the knob produces movement of at least one of the connecting component, the second support component and the sensing device.

45. The mounting device of claim 44, wherein the first cam is at least one of a standard cam having a side interface surface and a ramped cam having an end interface surface.

46. A mounting device configured for mounting a sensing device in relation to a supporting structure, the mounting device comprising:

a first support component capable of being mounted at least indirectly in relation to the supporting structure;

a second support component configured to support the sensing device;

a connecting component coupled between the first and second support components, wherein the connecting component supports the second support component in relation to the first support component; and an adjustor coupled to at least one of the first support component, the second support component and the connecting component that influences a positioning of the second support component in relation to the first support component;

wherein the adjustor includes a first ramp and also includes a first rotatable component interfacing the first ramp and rotatably coupled with respect to the first support component, wherein the first ramp interfaces a contact surface on at least one of the connecting component, the second support component and the sensing device, and wherein rotation of the first rotatable component produces movement of at least one of the connecting component, the second support component and the sensing device.

47. The mounting device of claim 46, wherein the first rotatable component includes at least one of the first cam and a first set screw.

48. The mounting device of claim 46, wherein the adjustor further includes a spring that counteracts a force applied to the first ramp by the first rotatable component, and wherein the first ramp further includes a base portion that is configured to slide and be retained within a C-shaped slideway.

49. A mounting device configured for mounting a sensing device in relation to a supporting structure, the mounting device comprising:

a first support component capable of being mounted at least indirectly in relation to the supporting structure;

a second support component configured to support the sensing device;

a connecting component coupled between the first and second support components, wherein the connecting component supports the second support component in relation to the first support component; and an adjustor coupled to at least one of the first support component, the second support component and the connecting component that influences a positioning of the second support component in relation to the first support component;

wherein the adjustor includes at least one of a first gear, a first push rod, a first cam, and a first ramp, wherein the connecting component includes a yoke, wherein actuation of the adjustor results in rotation of the sensing device relative to the supporting structure about at least one rotational axis, and wherein the at least one rotational axis includes at least one of a first axis of rotation of the second support component with respect to the yoke, a second axis of rotation of the yoke with respect to the first support component, and a third axis of rotation of a first portion of the yoke with respect to a second portion of the yoke.

50. The mounting device of claim 49, wherein the adjustor includes at least one of a second gear, a second push rod, a second cam, and a second ramp, and wherein the actuation of the adjustor results in the rotation of the sensing device relative to the supporting structure about at least two of the first, second and third axes.

51. A mounting device configured for mounting a sensing device in relation, to a supporting structure, the mounting device comprising:

a first support component capable of being mounted at least indirectly in relation to the supporting structure;

a second support component configured to support the sensing device;

a connecting component coupled between the first and second support components, wherein the connecting component supports the second support component in relation to the first support component; and an adjustor coupled to at least one of the first support component, the second support component and the connecting component that influences a positioning of the second support component in relation to the first support component;

wherein at least one of the support components is coupled to the connecting component by at least one of an overmolded pin having a swaged over portion, a first pin that is snapped into one of a first slot and a first groove, a second pin having a snap fit portion that is snapped into one of a second slot and a second groove, a bump that is configured to fit within a complementary dimple, a third pin that is press fit into a third slot by way of movement of the pin into the third slot in a direction that is substantially perpendicular to a central axis of the third pin, a component that is heat staked, a fourth pin that is press fit into a complementary hole, a screw, a bolt, and another fastening means.

* * * * *